United States Patent
Sone et al.

(10) Patent No.: US 8,273,258 B2
(45) Date of Patent: Sep. 25, 2012

(54) FINE PATTERN FORMING METHOD

(75) Inventors: Takashi Sone, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 313 days.

(21) Appl. No.: 12/651,519

(22) Filed: Jan. 4, 2010

(65) Prior Publication Data

US 2010/0170871 A1    Jul. 8, 2010

(30) Foreign Application Priority Data

Jan. 7, 2009    (JP) .................. 2009-001745

(51) Int. Cl.
*C03C 15/00* (2006.01)
*B44C 1/22* (2006.01)

(52) U.S. Cl. .............. 216/47; 216/58; 216/67; 438/669; 438/694; 438/725

(58) Field of Classification Search .................. 216/47, 216/58, 67; 438/669, 694, 725
See application file for complete search history.

(56) References Cited

U.S. PATENT DOCUMENTS

| | | | |
|---|---|---|---|
| 2003/0148224 A1* | 8/2003 | Vahedi et al. ................. | 430/314 |
| 2008/0153287 A1* | 6/2008 | Jeong ........................... | 438/669 |
| 2010/0093175 A1* | 4/2010 | Niroomand et al. .......... | 438/694 |

FOREIGN PATENT DOCUMENTS

| | | |
|---|---|---|
| JP | 04-071222 | 3/1992 |
| JP | 2757983 | 6/1998 |
| JP | 2004-80033 | 3/2004 |
| JP | 2010-516059 | 5/2010 |
| WO | WO2008/149988 | 12/2008 |

OTHER PUBLICATIONS

Japanese Office Action dated Nov. 16, 2010 with English translation.

* cited by examiner

*Primary Examiner* — Nadine G Norton
*Assistant Examiner* — Mahmoud Dahimene
(74) *Attorney, Agent, or Firm* — IPUSA, PLLC

(57) ABSTRACT

A disclosed fine pattern forming method includes steps of: forming patterns made of a first photoresist film, arranged at a first pitch on a film; trimming the patterns made of the first photoresist film; depositing a protection film on the patterns made of the first photoresist film on the trimmed patterns made of the first photoresist film, the protection film being made of reaction products of an etching gas, thereby obtaining first patterns; forming other patterns made of a second photoresist film, arranged at a second pitch, on the protection film, the other patterns made of the second photoresist film being shifted by half of the first pitch from the corresponding patterns made of the first photoresist film; trimming the other patterns made of the second photoresist film into second patterns; and etching the film using the first patterns and the second patterns.

14 Claims, 16 Drawing Sheets

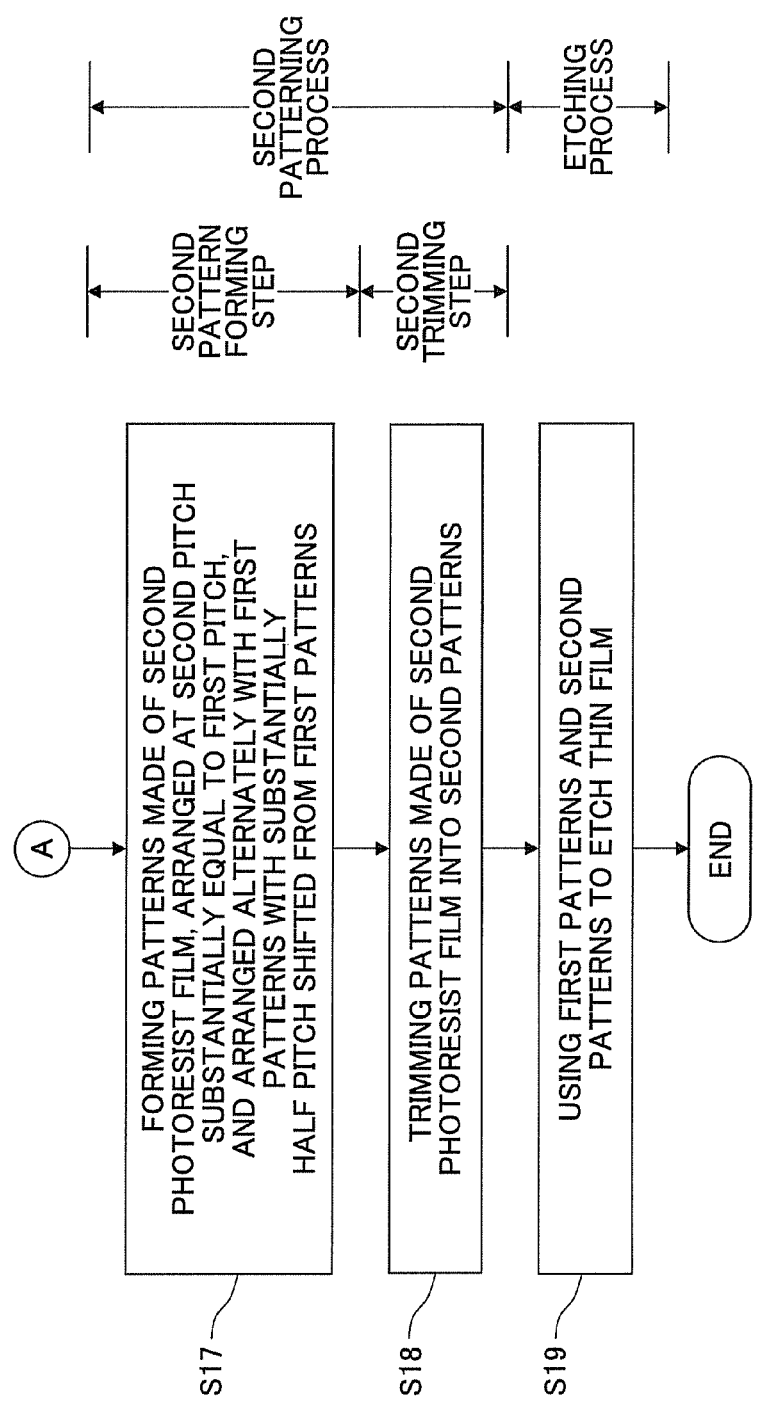

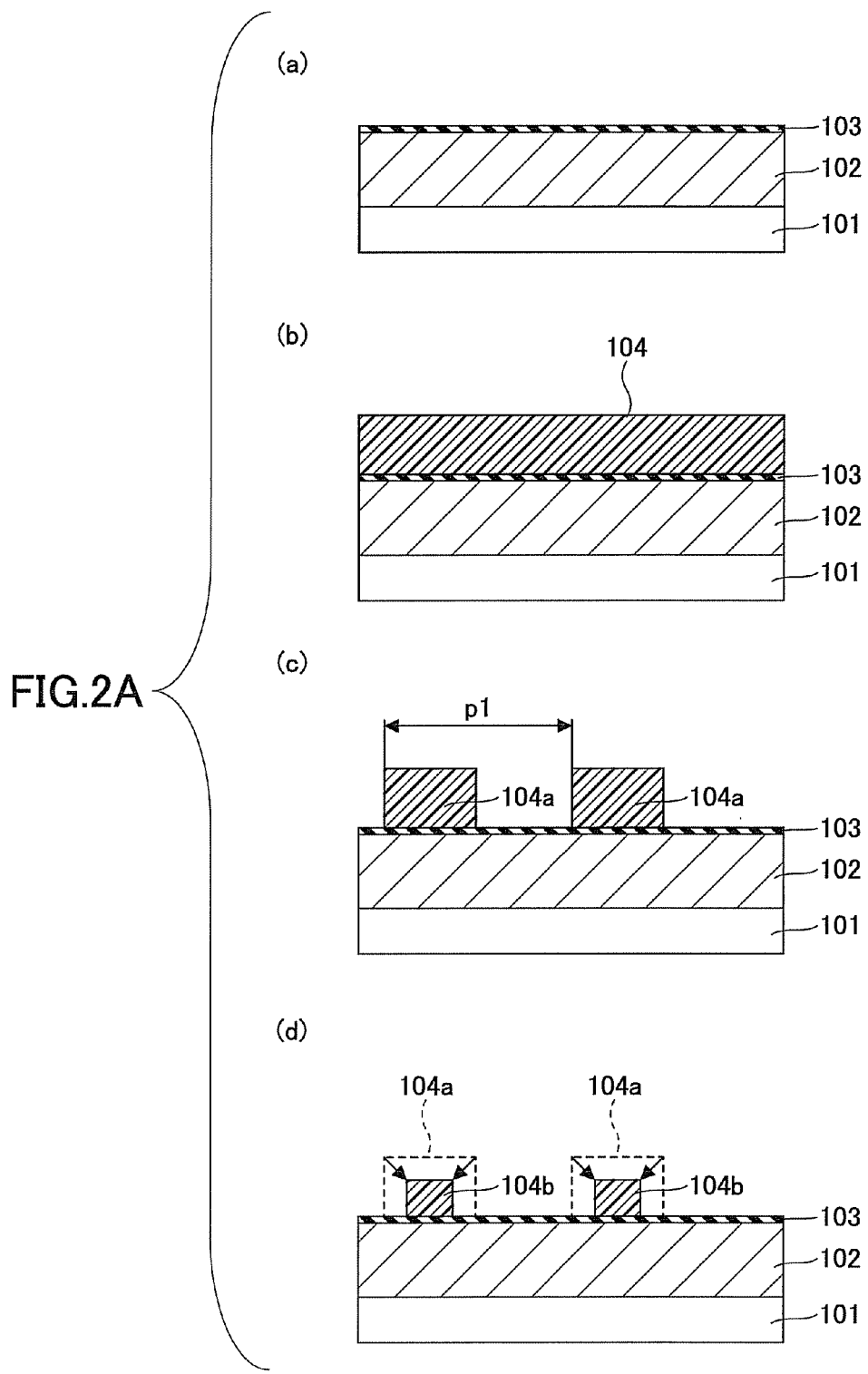

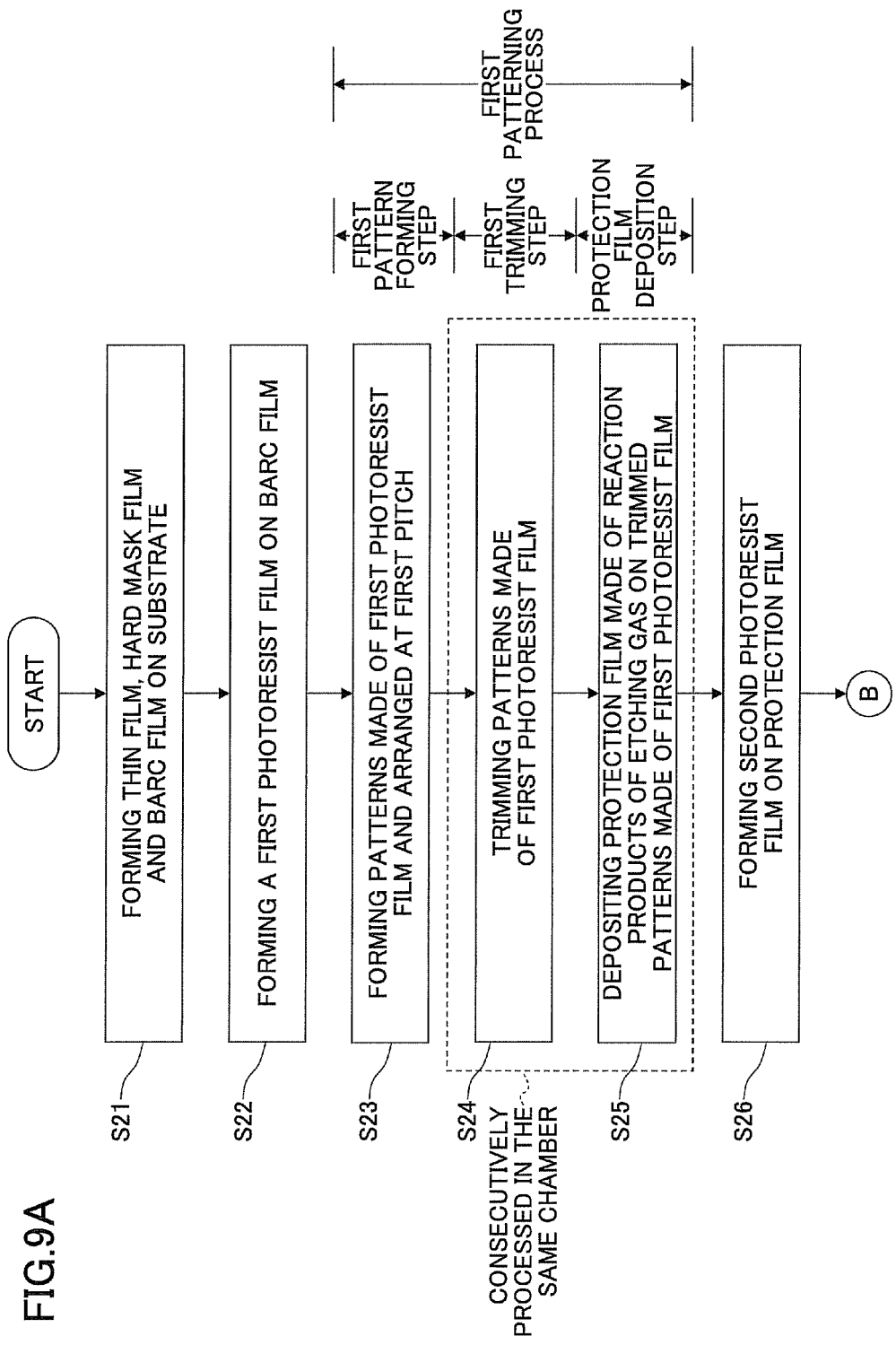

(a)

(b)

(c)

(d)

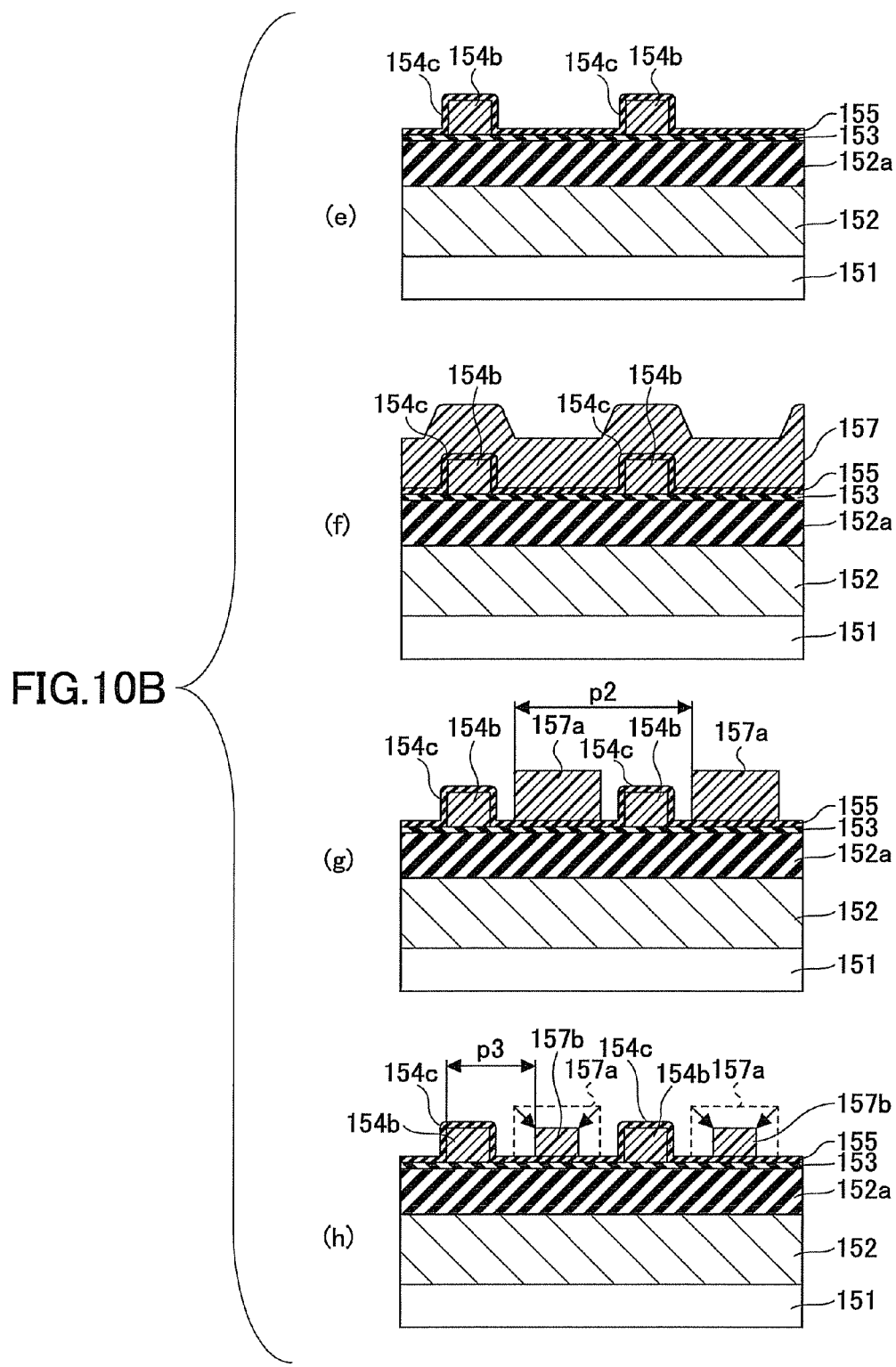

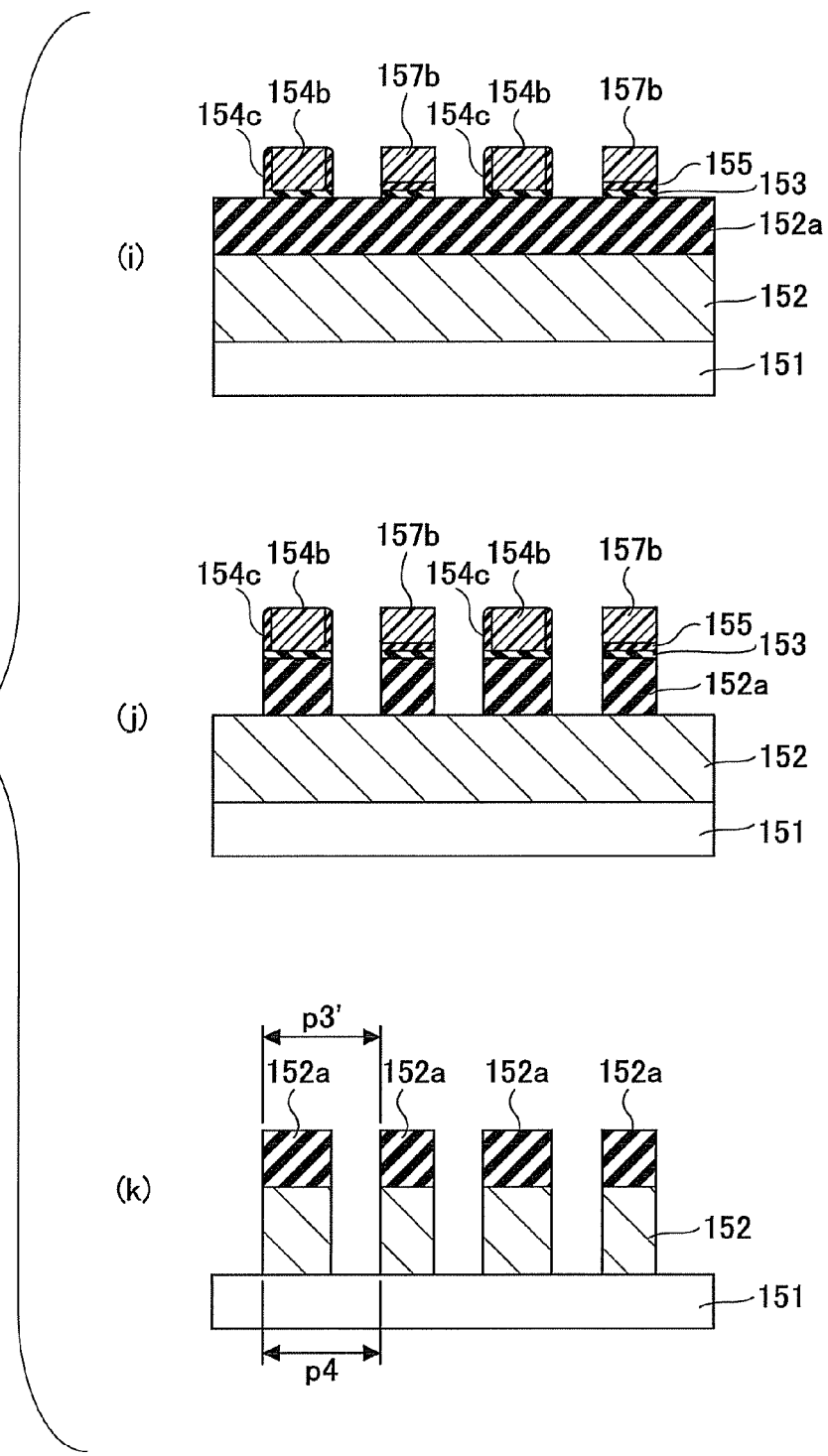

FINE PATTERN FORMING METHOD

CROSS-REFERENCE TO RELATED APPLICATIONS

The present application is based on Japanese Patent Application No. 2009-001745 filed with the Japanese Patent Office on Jan. 7, 2009, the entire contents of which are hereby incorporated herein by reference.

BACKGROUND OF THE INVENTION

1. Field of the Invention

The present invention relates to a fine pattern forming method used in a semiconductor device fabricating process, and more specifically to a fine pattern forming method that is capable of precisely adjusting a pattern dimension when forming a pattern having a dimension below a photolithography resolution limit without increasing production cost.

2. Description of the Related Art

Along with a demand for higher integration, a line width and a separation width required for a fabrication process become smaller. Generally, a fine pattern is formed by employing a photolithography technology in order to create a photoresist pattern and etching various underlying thin films using the photoresist pattern as an etching mask. Therefore, the photolithography technology is playing a crucial role when forming a fine pattern. However, further decreasing dimensions in semiconductor devices demand finer patterns below the resolution limit of the photolithography technology. Specifically, because it is thought that ArF liquid immersion photolithography, which is a main-stream photolithography technology of today, may reach a critical limit in a 4×nm generation, a new fine pattern forming technology called double patterning, which is promising to realize a finer pattern in a 3×nm generation, is under vigorous research and development.

Such an enabling technology for forming a pattern below the resolution limit is disclosed, for example, in Patent Document 1.

Patent Document 1 discloses a fine pattern forming method for forming a fine pattern in the following manner. First, a first photosensitive film pattern (a first pattern) having first lines is formed; the first pattern is baked; a silicon oxide film is formed on the first pattern; a second photosensitive film pattern (a second pattern) is formed having second lines between every adjacent two of the first lines; the silicon oxide film is etched with the second pattern; and a thin film below the first pattern is etched with the first and the second patterns.

According to this method disclosed in Patent Document 1, because two photomasks are used to form the first and the second patterns, the effective resolution can be more than doubled, when compared with a fine pattern formed with only one photomask, thereby enabling the fine pattern below the resolution limit of the current photolithography technology.

As a fine pattern forming method for forming a pattern below the resolution limit, which includes the above-mentioned method, a side wall transfer (SWT) process, a Litho-Etch-Litho-Etch (LELE) process and a Litho-Litho-Etch (LLE) process attract attention. In the LELE process, after the first lithography is carried out to form a first pattern, a first etching process is carried out using the first pattern; and then after second lithography is carried out to form a second pattern, a second etching process is carried out using the second pattern. On the other hand, in the LLE process, after the first lithography is carried out, the second photolithography is carried out and then an etching process is carried out. Namely, the LLE process has only one etching process while both the lithography and the etching are repeated twice in the LELE process. Therefore, the LLE process is advantageous in reducing production cost, compared with the LELE process.

However, in the LLE process, when the second photoresist film to be used in forming the second pattern is coated on the first pattern formed on a substrate, the first pattern has to be protected, or undergo a so-called resist freezing process, in order to prevent the first pattern from being dissolved by a solution such as an organic solvent included in the second photoresist film. As a technology for protecting the first pattern, a silicon oxide film is deposited on the first pattern as a protecting film, an example of which is disclosed in Patent Document 2.

Specifically, Patent Document 2 discloses a technology capable of preventing the photoresist pattern from being thinned and reducing striation and/or wiggling in a fine pattern by forming the silicon oxide film on the photoresist film, although Patent Document 2 does not describe a method for forming a fine pattern below the resolution limit.

Patent Document 1: Japanese Patent Publication No. 2757983.

Patent Document 2: Japanese Patent Application Laid-Open Publication No. 2004-080033.

SUMMARY OF THE INVENTION

When the silicon oxide film is deposited on the first pattern in order to protect the first pattern in the LLE process, there are the following problems.

When depositing the silicon oxide film, a first process gas including organic silicon and a second process gas including activated oxygen species are supplied toward the substrate in a film deposition apparatus for depositing the silicon oxide film. Namely, such a process has to be carried out, which increases the number of processes. In addition, process conditions for depositing the silicon oxide film over the photoresist pattern may be determined after several preliminary experiments.

Moreover, while critical dimensions (CDs) of the first and the second patterns are preferably the same when the first pattern forming process and the second pattern forming process are carried out in the LLE process for forming a fine pattern, it is difficult to equalize the critical dimensions because the silicon oxide film is formed on the first pattern.

Specifically, when the silicon oxide film is formed on the first pattern, the first pattern is not sufficiently tolerant of organic solvent and developer used in forming the second pattern. Therefore, the first pattern is likely to be deformed when forming the second pattern, and thus the critical dimensions of the first and the second patterns cannot be the same.

In addition, when the silicon oxide film is formed on the first pattern, an underlying film is etched using the first pattern on which the silicon oxide film remains and the second patterns. An etching rate ratio of the first pattern with respect to the underlying film tends to be different from an etching rate ratio of the second pattern with respect to the underlying film. Therefore, CD values of patterns transferred from the first pattern may be different from CD values of pattern transferred from the second pattern, and thus the same CD values cannot be realized.

The present invention has been made in view of the above, and provides a fine pattern forming method that is capable of reducing the number of processes when forming a fine pattern in the LLE process and reducing a difference between critical dimension values of patterns transferred from first and second patterns, thereby reducing variations in critical dimensions of the etched film.

An aspect of the present invention provides a fine pattern forming method for patterning a film formed on a substrate. The fine pattern forming method includes steps of: forming patterns made of a first photoresist film, arranged at a first pitch on the film; trimming the patterns made of the first photoresist film; depositing a protection film on the patterns made of the first photoresist film on the trimmed patterns made of the first photoresist film, the protection film being made of reaction products of an etching gas, thereby obtaining first patterns; forming other patterns made of a second photoresist film, arranged at a second pitch, on the protection film, the patterns made of the second photoresist film being arranged with half of the first pitch shifted from the patterns made of the first photoresist film; trimming the patterns made of the second photoresist film into second patterns; and etching the film using the first patterns and the second patterns.

BRIEF DESCRIPTION OF THE DRAWINGS

FIG. 1B is a flowchart for explaining steps of the fine pattern forming method according to the first embodiment of the present invention, following the flowchart of FIG. 1A;

FIG. 2A illustrates cross-sectional views of fine pattern structures at corresponding steps of the fine pattern forming method according to the first embodiment of the present invention (part 1);

FIG. 9A is a flowchart for explaining steps of a fine pattern forming method according to a second embodiment of the present invention;

FIG. 10B illustrates cross-sectional views of fine pattern structures at corresponding steps of the fine pattern forming method according to the second embodiment of the present invention (part 2); and FIG. 10C illustrates cross-sectional views of fine pattern structures at corresponding steps of the fine pattern forming method according to the second embodiment of the present invention (part 3).

DETAILED DESCRIPTION OF THE PREFERRED EMBODIMENT

Figure 1A:
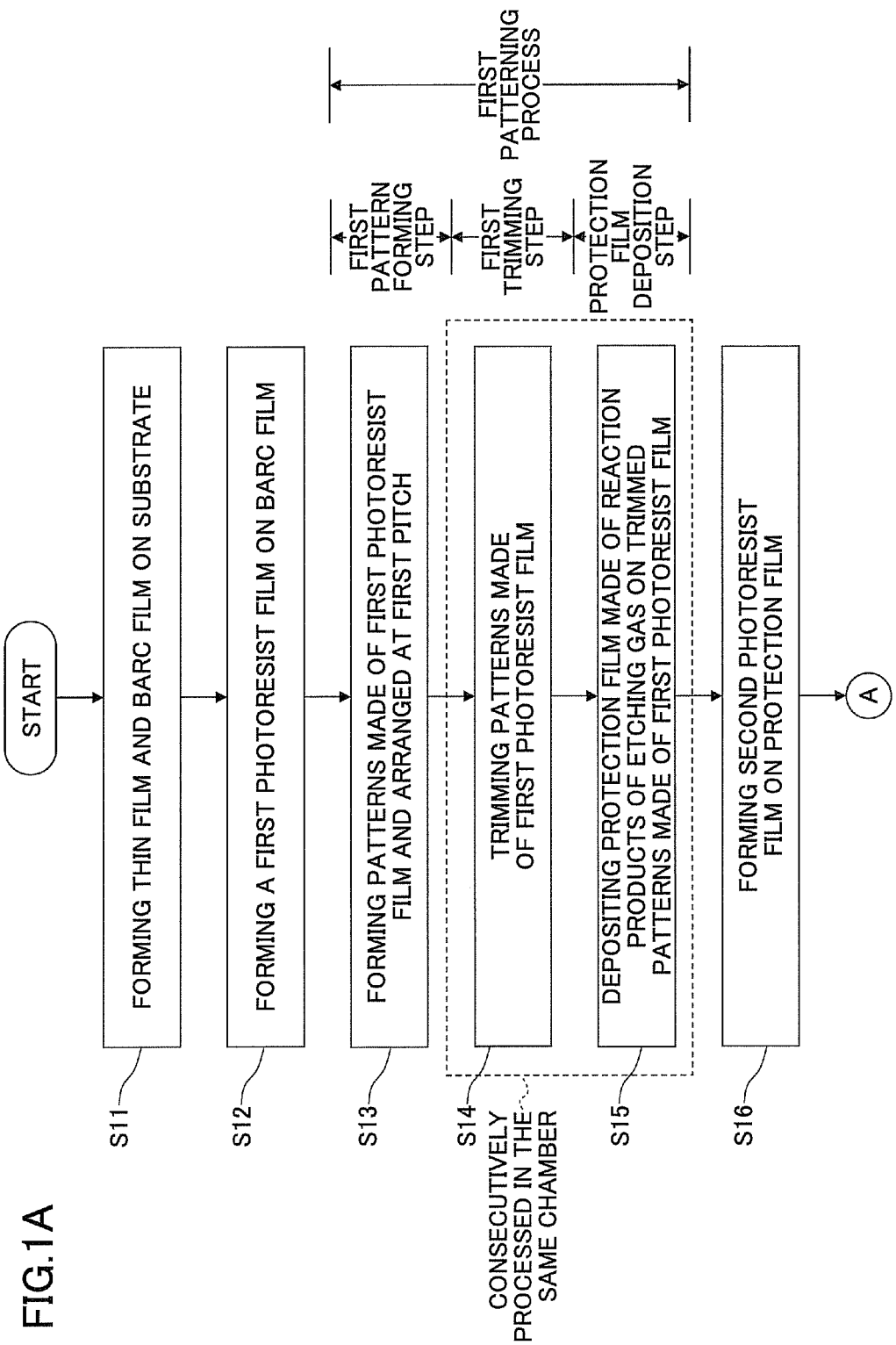
FIG. 1A is a flowchart for explaining steps of a fine pattern forming method according to a first embodiment of the present invention.

According to an embodiment of the present invention, there is provided a fine pattern forming method that is capable of reducing the number of processes when forming a fine pattern in the LLE process and reducing a difference between critical dimension values of patterns transferred from first patterns and second patterns, thereby reducing variations in critical dimensions of the etched film.

Non-limiting, exemplary embodiments of the present invention will now be described with reference to the accompanying drawings. In the drawings, the same or corresponding reference marks are given to the same or corresponding members or components. It is to be noted that the drawings are illustrative of the invention, and there is no intention to indicate scale or relative proportions among the members or components, or between thicknesses of various layers, alone or combined. Therefore, the specific thickness or size should be determined by a person having ordinary skill in the art in view of the following non-limiting embodiments.

First Embodiment

Figure 2B:
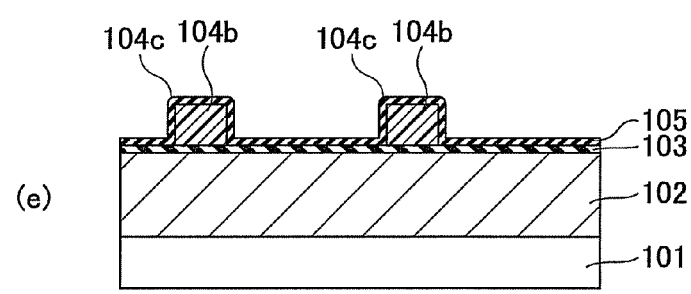
FIG. 2B illustrates cross-sectional views of fine pattern structures at corresponding steps of the fine pattern forming method according to the first embodiment of the present invention (part 2)
Figure 2B:
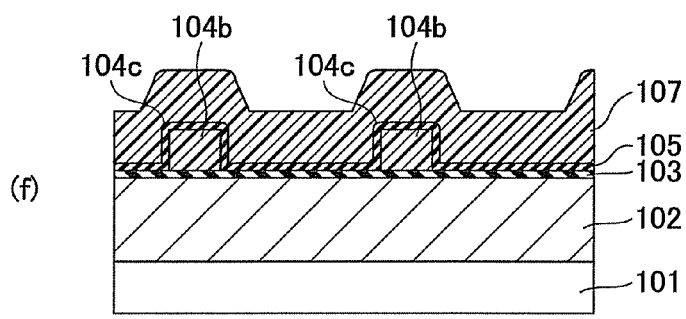
Figure 2B:
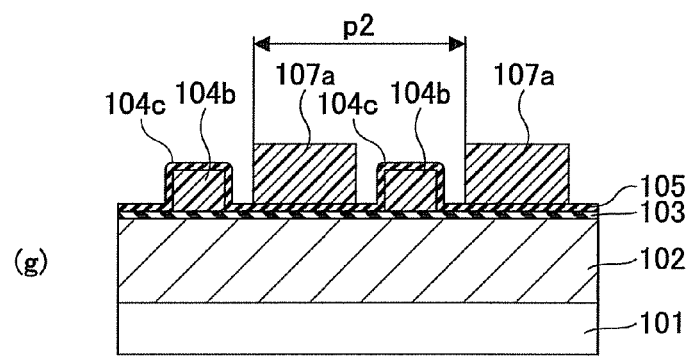
Figure 2C:
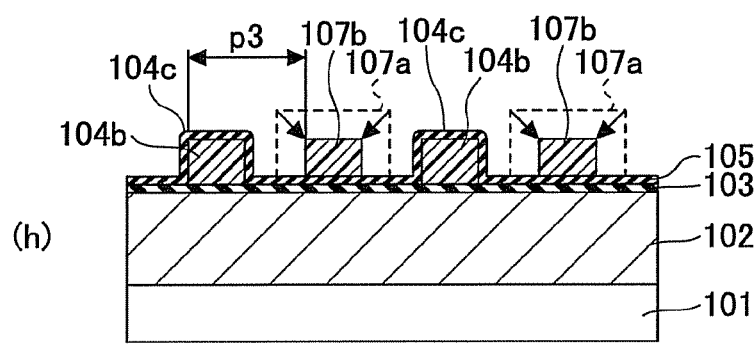
FIG. 2C illustrates cross-sectional views of fine pattern structures at corresponding steps of the fine pattern forming method according to the first embodiment of the present invention (part 3)
Figure 2C:
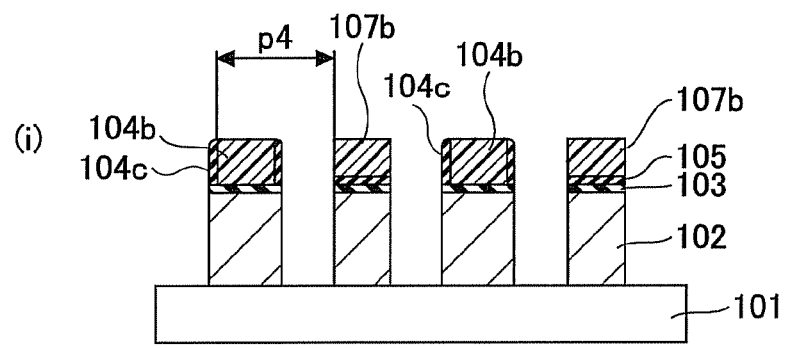

Referring to FIGS. 1A through 2C, a fine pattern forming method according to a first embodiment of the present invention is explained. FIGS. 1A and 1B are flowcharts for explaining the fine pattern forming method according to the first embodiment. FIGS. 2A through 2C illustrate schematic cross-sectional views of a fine pattern structure for corresponding steps. Specifically, a subsection (a) of FIG. 2A through a subsection (i) of FIG. 2C illustrate cross-sectional views of fine pattern structures after corresponding Steps S11 through S19 in FIGS. 1A and 1B.

First at Step Sit, a thin film 102 is formed on a semiconductor substrate 101 and a bottom anti-reflection coating (BARC) film 103 is formed on the thin film 102 by applying an anti-reflection material, so that an anti-reflection coating (BARC) film 103 is formed, as shown in the subsection (a) of FIG. 2A. The thin film 102 is subject to fine patterning, as described later.

The semiconductor substrate 101 may be made of silicon, but may include a built-up wafer where various electrically conductive layers and insulating layers such as an inter-metal dielectric layer are formed in accordance with types of semiconductor devices or integrated circuits to be formed in or on the semiconductor substrate.

The thin film 102 may be made of an insulating material such as silicon nitride (SiN) and silicon oxide ($SiO_x$), or an electrically conductive material such as amorphous silicon and polysilicon, for example. In this embodiment, the thin film 102 is made of SiN. In addition, a thickness of the thin film 102 may be about 20 nm through about 200 nm, for example.

The BARC film 103 may be made of amorphous carbon or various organic materials such as polyphenol and photoresist including i-line photoresist, for example. When amorphous carbon is used, the BARC film 103 is formed by a chemical vapor deposition method. When an organic material is used, the BARC film 103 is preferably formed by a spin-on method. In addition, a thickness of the BARC film 103 may be about 30 nm through about 300 nm, for example.

Next, at Step S12, a first photoresist film 104 is formed on the BARC film 103 by coating photoresist, as shown in the subsection (b) of FIG. 2A. The first photoresist film 104 may be made of an ArF photoresist, for example. A thickness of the first photoresist film 104 may be about 50 nm through 200 nm, for example.

Subsequently, a first patterning process (steps S13 through S15) is carried out. First at Step S13 (a first pattern forming step), the photoresist film 104 formed at Step S12 is exposed to exposure light and then developed, so that the first photoresist film 104 is patterned into patterns 104a, as shown in the subsection (c) of FIG. 2A. The patterns 104a are arranged at a first pitch of p1. In this embodiment, the first pitch of p1 is the lowest that can be realized based on the resolution limit of an exposure apparatus used widely in this industry.

Incidentally, Step S13 constitutes a first photolithography process in a Litho-Litho-Etch (LLE) process, along with Step S12.

Next, at Step S14 (a first trimming step), the patterns 104a are trimmed into patterns 104b, as shown in the subsection (d) of FIG. 2A. The trimming process is preferably carried out, for example, under an environment including oxygen radicals or ozone gas at a room temperature through about 100° C. As shown in the subsections (c) and (d) of FIG. 2A, a line width of the patterns 104b becomes narrower after the trimming process than before the trimming process. Such a trimming step may be called a slimming process or a shrinking process.

More specifically, Step S14 is carried out in a chamber of an etching apparatus using oxygen-containing gas plasma or ozone gas, in this embodiment. When the oxygen-containing gas plasma is used, at least one of oxygen gas, NO gas, $N_2O$ gas, $H_2O$ gas and $O_3$ gas may be supplied to the chamber and activated into plasma.

Then, Step S15 (a protection film deposition step) is continuously carried out in the same chamber of the etching apparatus that has been used at Step S14. Specifically, an etching gas is supplied to the chamber of the etching apparatus, so that a protection film 105, which is made of reaction products of the etching gas, is deposited on the patterns 104b and the BARC film 103 that is exposed between the patterns 104b, as shown in the subsection (e) of FIG. 2. The protection film 105 includes first patterns 104c corresponding to the underlying patterns 104b (the subsection (e) of FIG. 2B). Such a protection film deposition process may be called a resist freezing process or a hardening process.

More specifically, the etching gas may be fluorocarbon gas or halogen-containing gas, for example. When supplied to the chamber of the etching apparatus, these gases are decomposed or reacted with the patterns 104b originating from the first photoresist film 104, and/or the BARC film 103, thereby producing reaction (or decomposition) products. Then, the reaction (or decomposition) products are deposited on the patterns 104b and the BARC film 103, so that the protection film 105 including the first patterns 104c is obtained.

As the fluorocarbon gas, at least one of $CH_3F$, $CHF_3$, $CF_4$, $C_4F_6$, $CH_2F_2$, and $Cl_2$ may be used, for example. In addition, as the halogen-containing gas, at least one of HBr, $SF_6$, $Cl_2$, and HCl may be used, for example. Moreover, Ar gas or oxygen gas may be used as an additive. Furthermore, gas mixtures of $CF_4/N_2$ and $C_4F_8/N_2$ may be used as the etching gas or a source gas for the protection film 105.

Next, at Step S16, a second photoresist film 107 is formed on the protection film 105 (including the first patterns 104c) by coating photoresist, as shown in the subsection (f) of FIG. 2B.

Incidentally, another BARC film may be formed by applying an anti-reflection coating material on the protection film 105 between Step S15 and Step S16. In this case, the second photoresist film 107 is formed on the BARC film formed on the protection film 105.

Subsequently, a second patterning process (Steps S17 and S18) is carried out. First, at Step S17 (a second pattern forming step), the second photoresist film 107 formed at Step S16 is exposed to exposure light and developed, so that patterns 107a are formed and arranged at a second pitch p2, as shown in the subsection (g) of FIG. 2B. In this embodiment, the patterns 107a take the same line-and-space pattern as the patterns 104a originating from the first photoresist film 104, and thus the second pitch p2 of the patterns 107a is the same as the first pitch p1 of the patterns 104a. In addition, each of the patterns 107a is located in substantially the center between its two adjacent first patterns 104c formed at Step S15, as shown in the subsection (g) of FIG. 2B. Namely, the patterns 107a are arranged alternately with the first patterns 104c shifted by half of the first pitch p1 from the corresponding first patterns 104c.

Incidentally, Step S17 constitutes a second photolithography process in the Litho-Litho-Etch (LLE) process, along with Step S16.

Next, at Step S18 (a second trimming step), the patterns 107a originating from the second photoresist film 107 are trimmed, so that second patterns 107b are obtained, as shown in the subsection (h) of FIG. 2C. The trimming process is preferably carried out, for example, under an environment including oxygen radicals or ozone gas at a room temperature through about 100° C. It should be noted that the protection film 105 including the first patterns 104c is scarcely influenced by the oxygen radicals or ozone gas.

Referring to the subsection (h) of FIG. 2C, an etching mask composed of the first patterns 104c and the second patterns 107b is formed after the second trimming step (Step S18). Because the first patterns 104c and the corresponding second patterns 107b are alternately shifted by half of the first (or second) pitch p1 (or p2) from each other, the etching mask has its pitch p3 at half of the first (or second) pitch p1 (or p2), in this embodiment. Namely, this etching mask has a pitch below the resolution limit of the exposure apparatus.

Subsequently, at Step S19 (an etching process), the protection film 105, the BARC film 103, and the thin film 102 are etched using the etching mask having the first patterns 104c and the second patterns 107b. As a result, the thin film 102 is formed into a predetermined fine pattern. A pitch p4 of the patterned thin film 102 is substantially the same as the pitch p3 of the etching mask. Namely, the fine pattern having a pitch below the resolution limit can be obtained in this embodiment.

Figure 3:
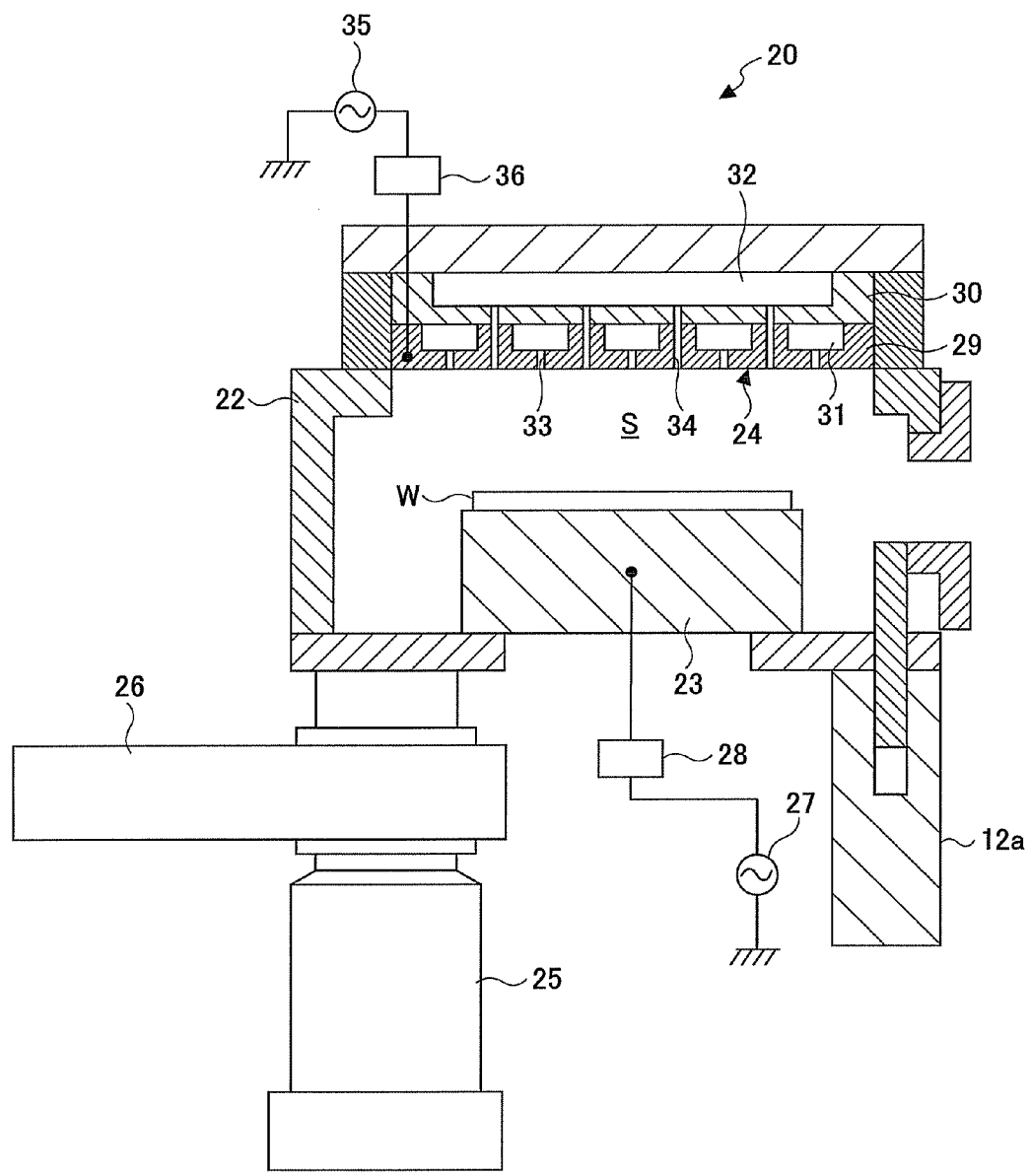
FIG. 3 is a schematic view of an etching apparatus preferably used for the fine pattern forming method according to the first embodiment of the present invention.

Next, referring to FIG. 3, an etching apparatus preferably used in the fine pattern forming method according to this embodiment of the present invention is explained. FIG. 3 is a cross-sectional view schematically illustrating the etching apparatus.

As shown, an etching apparatus 20 includes a chamber 22, a susceptor 23 arranged in the chamber 22, a showerhead 24 arranged in the upper portion of the chamber 22 to oppose the susceptor 22, an evacuation apparatus 25 such as a turbo molecular pump (TMP) for evacuating the chamber 22, and an adaptive pressure control (APC) valve 26 arranged between the chamber 22 and the evacuation apparatus 25 in order to control an inner pressure of the chamber 22.

A high frequency power source 27 is connected to the susceptor 23 via a matching box 28 in order to supply high frequency power to the susceptor 23. With this, the susceptor 23 may serve as a lower electrode. The matching box 28 reduces reflection of the high frequency power, so that the high frequency power is supplied to the susceptor 23 at the maximum supplying efficiency. The susceptor may radiate the high frequency power supplied from the high frequency power source 27 to a process space S.

The showerhead 24 is composed of a lower circular gas supplying section 29 and an upper circular gas supplying section 30 stacked on the lower circular gas supplying section 29. In addition, the lower circular gas supplying section has first buffer chambers 31, and the upper circular gas supplying section 30 has a second buffer chamber 32. The first buffer chambers 31 and the second buffer chamber 32 are in gaseous communication with the chamber 22 through gas conduits 33 and 34, respectively. Moreover, the first buffer chambers 31 and the second buffer chamber 32 are connected to a gas supplying system (not shown). With this, predetermined gases can be supplied to the first and the second buffer chambers 31 and 32.

Another high frequency power source 35 is connected to the showerhead 24 via another matching box 36 in order to supply high frequency power to the showerhead 24. With this, the showerhead 24 may serve as an upper electrode. The matching box 36 functions in the same manner as the matching box 28. The showerhead 24 may radiate the high frequency power supplied from the high frequency power source 35 to the process space S.

In the chamber 22 of the etching apparatus 20, high frequency power is supplied to the process space S from the susceptor 23 and/or the showerhead 24, so that a process gas supplied to the process space S from the showerhead 24 is activated into high density plasma, thereby generating ions and/or radicals. With these ions and/or radicals, the wafer W or the thin film formed on the wafer W is etched.

Incidentally, the showerhead 24 may be provided with an end-point detector (not shown) having an electron microscope that detects an etching end point by observing from above the wafer W placed on the susceptor 23.

Next, the trimming process carried out in the etching apparatus of FIG. 3 is explained. When carrying out the trimming process, an oxygen-containing gas is supplied to the first buffer chambers 31 from the gas supplying system and further to the process space S of the chamber 22 through the gas conduits 33. In addition, an inert gas is supplied to the second buffer chamber 32 from the gas supplying system and further to the process space S of the chamber 22 through the gas conduits 34.

Then, the high frequency power source 27 is turned on to generate a high frequency electric field in the chamber 22, and thus the oxygen-containing gas and the inert gas are activated into plasma by the high frequency electric field. With this, photoresist that forms the patterns 104a (the subsection (c) of FIG. 2A) is subjected to ashing by active oxygen species in the plasma, so that the height and the width of the patterns 104a are reduced. Namely, the patterns 104a are trimmed into the patterns 104b (the subsection (d) of FIG. 2A). This trimming process may be carried out for about 60 s through 600 s, for example. A flow rate of the oxygen-containing gas may be about 100 standard cubic centimeters per minute (sccm) through about 20000 sccm, and a flow rate of the inert gas may be about 100 sccm through about 20000 sccm, depending on the size of the chamber 22 and the number of the wafers W loaded into the chamber 22 at a time. In addition, the frequency and the electric power of the high frequency power from the high frequency power source 27 may be 13.56 MHz and about 5 W through about 1000 W, respectively. Moreover, an inner pressure of the chamber 22 may be about 13.3 Pa through about 665 Pa.

The oxygen-containing gas to be activated into plasma may be $O_2$ gas, NO gas, $N_2O$ gas, $H_2O$ gas, or $O_3$ gas, for example. The oxygen-containing gas is not limited to these gases, as long as oxygen radicals are generated. However, these oxygen-containing gases are preferably used, and $O_2$ gas is more preferable. Because the oxygen radicals or plasma of the oxygen-containing gas are used as an oxidizing agent, a substrate temperature at the time of the trimming process may be 300° C. or less. Moreover, the substrate temperature may 100° C. or less, or ideally, room temperature. In addition, the inert gas may be Ar gas or $N_2$ gas.

Alternatively, a gas mixture including $CO_2$ may be used as the oxygen-containing gas. In this case, this gas mixture is supplied to the chamber 22 of the etching apparatus 20, and plasma is generated from the gas mixture including $CO_2$. With this, the trimming process is carried out using active species generated from the gas mixture including $CO_2$. The active species may include ions such as $O_2^+$ neutral atoms such as O atoms, and $O_2^*$ (quasi stable) atoms.

When the gas mixture including $CO_2$ is used, the gas mixture preferably includes at least 25% of $CO_2$, or more preferably at least 50% of $CO_2$. Furthermore, the gas mixture most preferably includes at least 75% of $CO_2$. For example, combinations of $CO_2+O_2$, $CO_2+CO$, $CO_2+CO+O_2$, $CO_2+H_2O+O_2$, $CO_2+CO+H_2O$, $CO_2+N_2$, and $CO_2+H_2$ are used as the gas mixture including $CO_2$. Various inert gases may be added to these combinations or $CO_2$ gas.

When the gas mixture including $CO_2$ is used, the trimming process is carried out at a chamber pressure, preferably, from 0.013 Pa (0.1 mTorr) through 80 Pa (600 mTorr), more preferably, from 0.133 Pa (1 mTorr) through 26.66 Pa (200 mTorr), and most preferably, from 0.666 Pa (5 mTorr) through 13.33 Pa (100 mTorr).

In addition, when the gas mixture including $CO_2$ is used, the trimming process is carried out with high frequency power, preferably from 10 through 2000 W, more preferably from 50 through 1200 W, and most preferably from 10 through 1000 W.

Next, the protection film deposition process or the etching process carried out in the etching apparatus of FIG. 3 is explained. When the protection film deposition process or the etching process is carried out, the fluorocarbon gas is supplied to the first buffer chambers 31 from the gas supplying system and further to the process space S of the chamber 22 through the gas conduits 33. In addition, the halogen-containing gas is supplied to the second buffer chamber 32 from the gas supplying system and further to the process space S of the chamber 22 through the gas conduits 34. The fluorocarbon gas and the halogen-containing gas correspond to the etching gas in this embodiment.

Then, the high frequency power source 27 is turned on to generate a high frequency electric field in the chamber 22, and thus the fluorocarbon gas and the halogen-containing gas are activated into plasma by the high frequency electric field. With this, the protection film is deposited, or a layer below an etching mask is etched.

In this embodiment, the etching gas including the fluorocarbon gas and the halogen-containing gas is used for not only etching the layer below an etching mask but also depositing the protection film made of the reaction (decomposition) products, which are produced through decomposition of the etching gas and/or reaction of the etching gas with the layer below an etching mask and/or the etching mask. A deposition time of the protection film may be 60 s through 600 s, depending on the size of the chamber 22 of the etching apparatus, the number of the wafers W to be loaded at a time, and a target thickness of the protection film. A flow rate of the etching gas including the fluorocarbon gas and/or the halogen gas may be about 100 sccm through about 20000 sccm, depending on the size of the chamber 22 and the number of the wafers W loaded into the chamber 22 at a time. In addition, the frequency and the electric power of the high frequency power from the high frequency power source 27 may be 13.56 MHz and about 5 W through about 1000 W, respectively. Moreover, an inner pressure of the chamber 22 for this process may be about 13.3 Pa through about 665 Pa.

Incidentally, the high frequency power sources 27 and 35 may supply the high frequency power at a frequency of 2 MHz, or 27 MHz through 60 MHz to the susceptor 23 and the showerhead 24, respectively. By variously combining the frequencies from the high frequency power sources 27, 35, various high frequency electromagnetic fields may be generated in the process space S of the chamber 22.

As stated above, at least one of $CH_3F$, $CHF_3$, $CF_4$, $C_4F_8$, $CH_2F_2$, and $Cl_2$ may be used as the fluorocarbon gas, for example. Additionally, at least one of HBr, $SF_6$, $Cl_2$, and HCl may be used as the halogen-containing gas, for example.

Incidentally, while the first trimming step and the protection film deposition step are carried out in one chamber 22, two chambers 22 hermetically coupled via a transfer module, a gate valve, and the like may be prepared. In this case, after the first trimming step is carried out in one of the two chambers 22, the wafer W may be transferred to the other chamber 22, where the protection film deposition step is carried out.

In addition, a substrate processing system may be configured to include plural of the chambers 22, transfer modules, gate valves, loader modules, load lock modules, susceptors, an operational panel having a display made of a Liquid Crystal Display (LCD), which allows an operator to control the substrate processing system, and the like.

Figure 4:
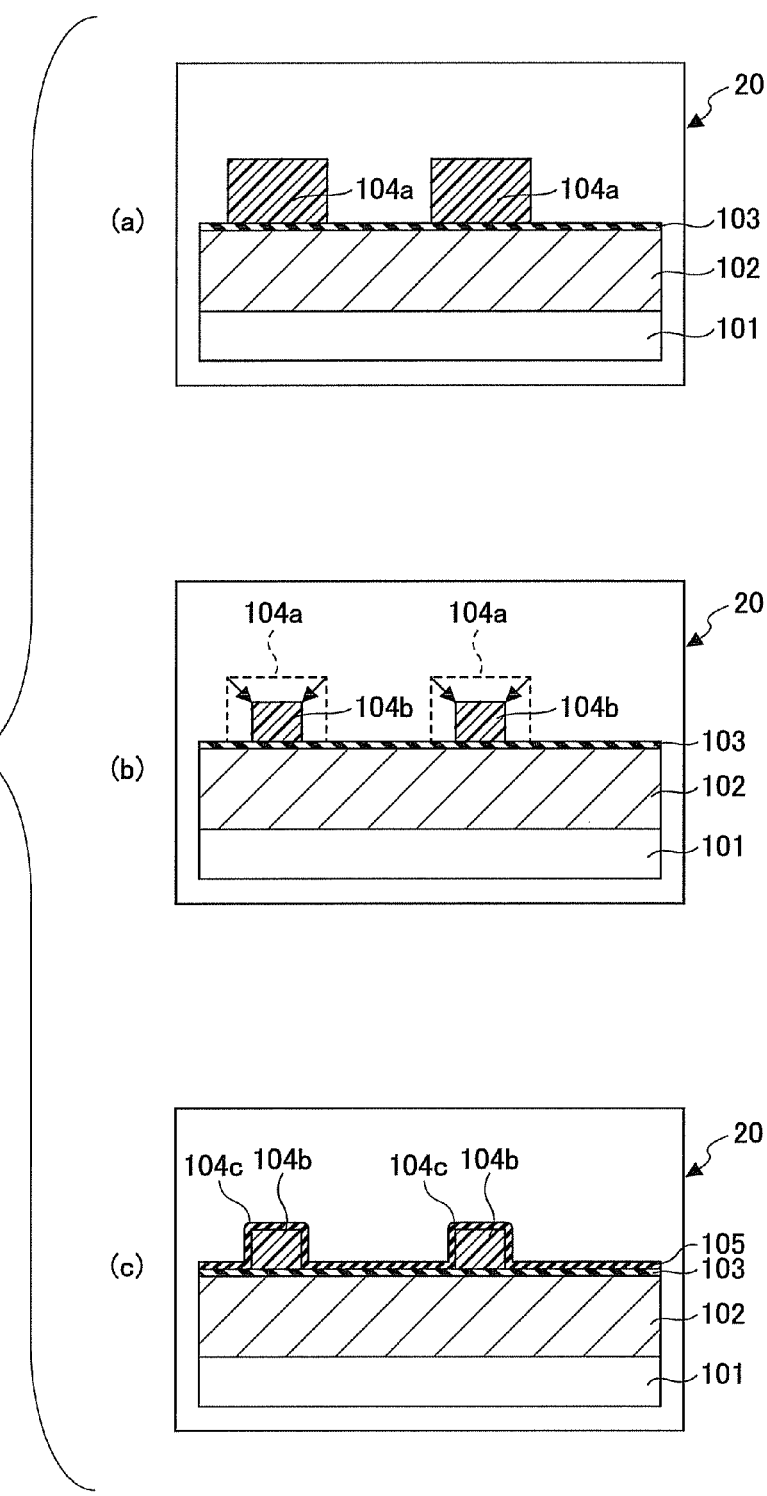
FIG. 4 includes cross-sectional views for explaining the fine pattern forming method according to the first embodiment of the present invention, where fine pattern structures are formed at a first trimming step and a protection film deposition step.
Figure 5:
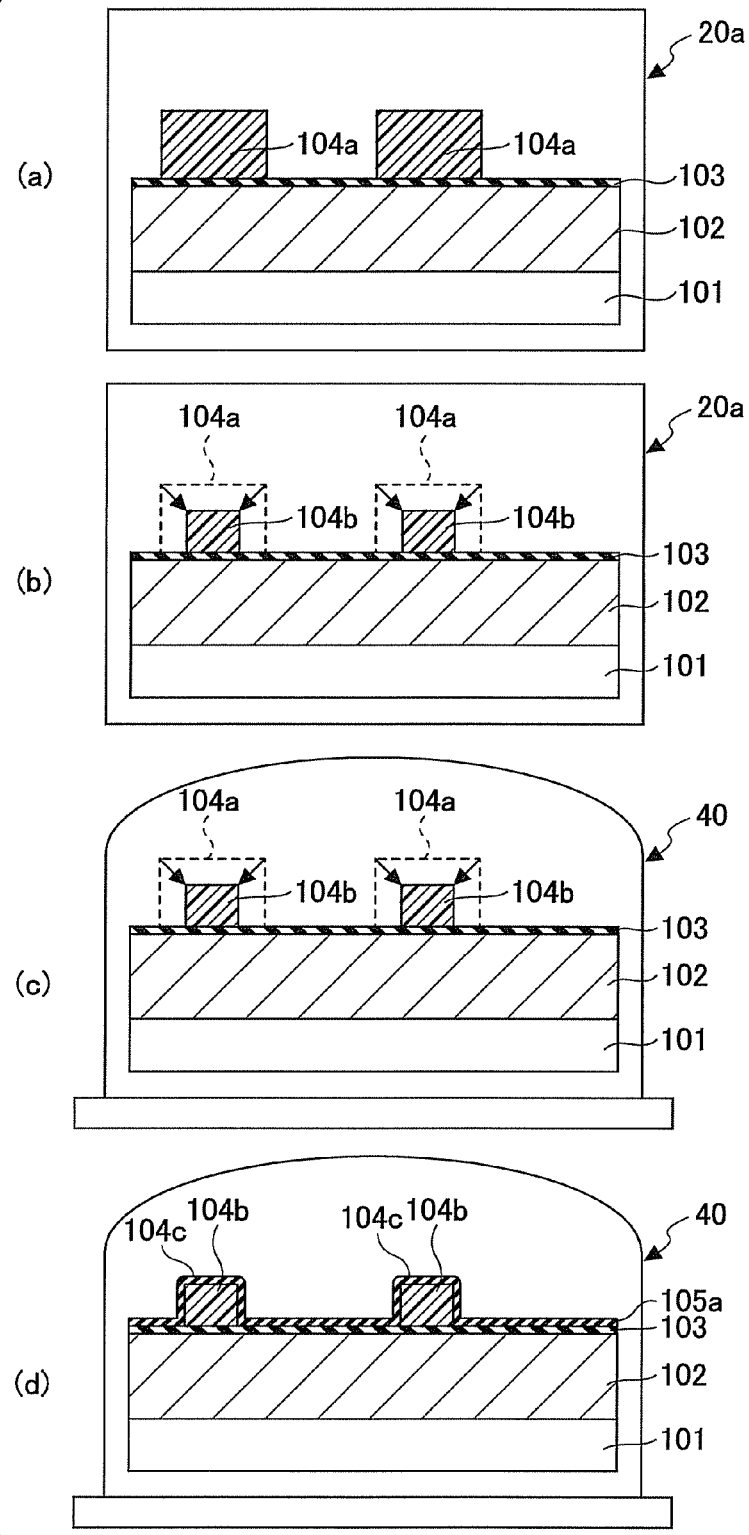
FIG. 5 includes cross-sectional views illustrating fine pattern structures according to a conventional fine pattern forming method, in comparison with the fine pattern forming method according to the first embodiment of the present invention.

Next, referring to FIG. 4, and FIG. 5 that illustrates the corresponding steps of a conventional method, the first trimming step and the protection film deposition step of the fine pattern forming method according to the embodiment are reviewed in order to explain advantages of this embodiment.

In the fine pattern forming method according to the embodiment, after the first pattern forming step is carried out (see the subsection (c) of FIG. 2A), the wafer W having the patterns 104a originating from the first photoresist film 104 is transferred into the etching apparatus 20, as shown in a subsection (a) of FIG. 4. Then, the first trimming step is carried out in the etching apparatus 20, where the patterns 104a are trimmed into the patterns 104b by oxygen-containing gas plasma or ozone gas, as shown in a subsection (b) of FIG. 4. Next, the protection film deposition step (photoresist freezing step or hardening step) is carried out in the same etching apparatus 20, as shown at subsection (c) of FIG. 4. Namely, the etching gas including the fluorocarbon gas and the halogen gas is supplied to the etching apparatus 20, so that the protection film 105 is deposited from the reaction (or decomposition) products of the etching gas on the patterns 104b and the BARC film 103. Subsequently, the wafer W is transferred from the etching apparatus 20 to a photoresist coater/developer (not shown), and the second photoresist film 107 is formed on the protection film 105 (see the subsection (f) of FIG. 2B).

On the other hand, according to the conventional method, after the first pattern forming step is carried out, the wafer W having the patterns 104a originating from the first photoresist film 104 is transferred into a photoresist coater/developer 20a rather than the etching apparatus 20, as shown in a subsection (a) of FIG. 5. Then, a trimming step is carried out in the photoresist coater/developer 20a in accordance with a photolithography technique, so that the patterns 104a are trimmed into the patterns 104b, as shown in a subsection (b) of FIG. 5. Next, the wafer W having the patterns 104b is transferred into a film deposition apparatus 40, as shown in a subsection (c) of FIG. 5. Then, a film deposition step, which corresponds to the protection film deposition step (Step S15) of this embodiment of the present invention, is carried out in the film deposition apparatus 40. Specifically, a silicon oxide film 105a is deposited on the patterns 104b and the BARC film 103 using an aminosilane precursor with oxygen-plasma or ozone gas. Subsequently, the wafer W is transferred from the etching apparatus 20 to a photoresist coater/developer (not shown), and the second photoresist film 107 is formed on the silicon oxide film 105a.

By comparing the subsections (a) through (c) of FIG. 4 and the subsections (a) through (d) of FIG. 5, it can be understood that the conventional method has an additional step. Namely, according to the fine pattern forming method of this embodiment, the first trimming step and the protection film deposition step are continuously carried out in the same etching apparatus where not only the oxygen-containing gas plasma or ozone gas but also the etching gas including the fluorocarbon and/or halogen-containing gas is available, while the first trimming step is carried out in the photoresist coater/developer and the film deposition film is carried out in the film deposition apparatus, according to the conventional method. Therefore, the number of the process steps can be reduced according to the embodiment of the present invention.

Incidentally, while the conventional method where the first trimming step is carried out in the photoresist coater/developer is explained with reference to FIG. 5, the first trimming step may be carried out in an ashing apparatus employing oxygen-containing gas plasma in another conventional method. When compared to such a conventional method, the number of steps can be reduced in the fine pattern forming method according to this embodiment of the present invention.

Next, working examples carried out based on the fine pattern forming method according to this embodiment of the present invention are explained.

Example 1

First, the trimming step was carried out by supplying an oxygen-containing gas to the etching apparatus so that the patterns 104a originating from the first photoresist film 104 on the BARC film formed on a wafer are trimmed into the patterns 104b. Specifically, this trimming step was carried out under the following conditions.

A flow rate of $O_2$ gas as the oxygen-containing gas was 50 sccm; a flow rate of Ar gas was 200 sccm; an inner pressure of the chamber of the etching apparatus was 2.66 Pa (20 mTorr); high frequency power applied to the upper electrode (the showerhead 24 (FIG. 3)) was 200 W; and a trimming time was 20 s. Incidentally, no bias voltage is applied to the lower electrode (susceptor 23 (FIG. 3)).

Next, the protection film 105 was deposited from the reaction (and/or decomposition) products of the etching gas on the patterns 104b and the BARC film 103 in the same etching apparatus. This deposition of the protection film was carried out under the following conditions.

A flow rate of $CH_3F$ gas was 100 scorn; a flow rate of HBr gas was 100 sccm; an inner pressure of the chamber of the etching apparatus was 2.66 Pa (20 mTorr); high frequency power applied to the upper electrode and the lower electrode were 600 W and 200 W, respectively; and a deposition time was 55 s. Incidentally, the $CH_3F$ gas and the HBr gas are mixed and supplied to the first buffer chamber 32 (FIG. 3).

Figure 6:
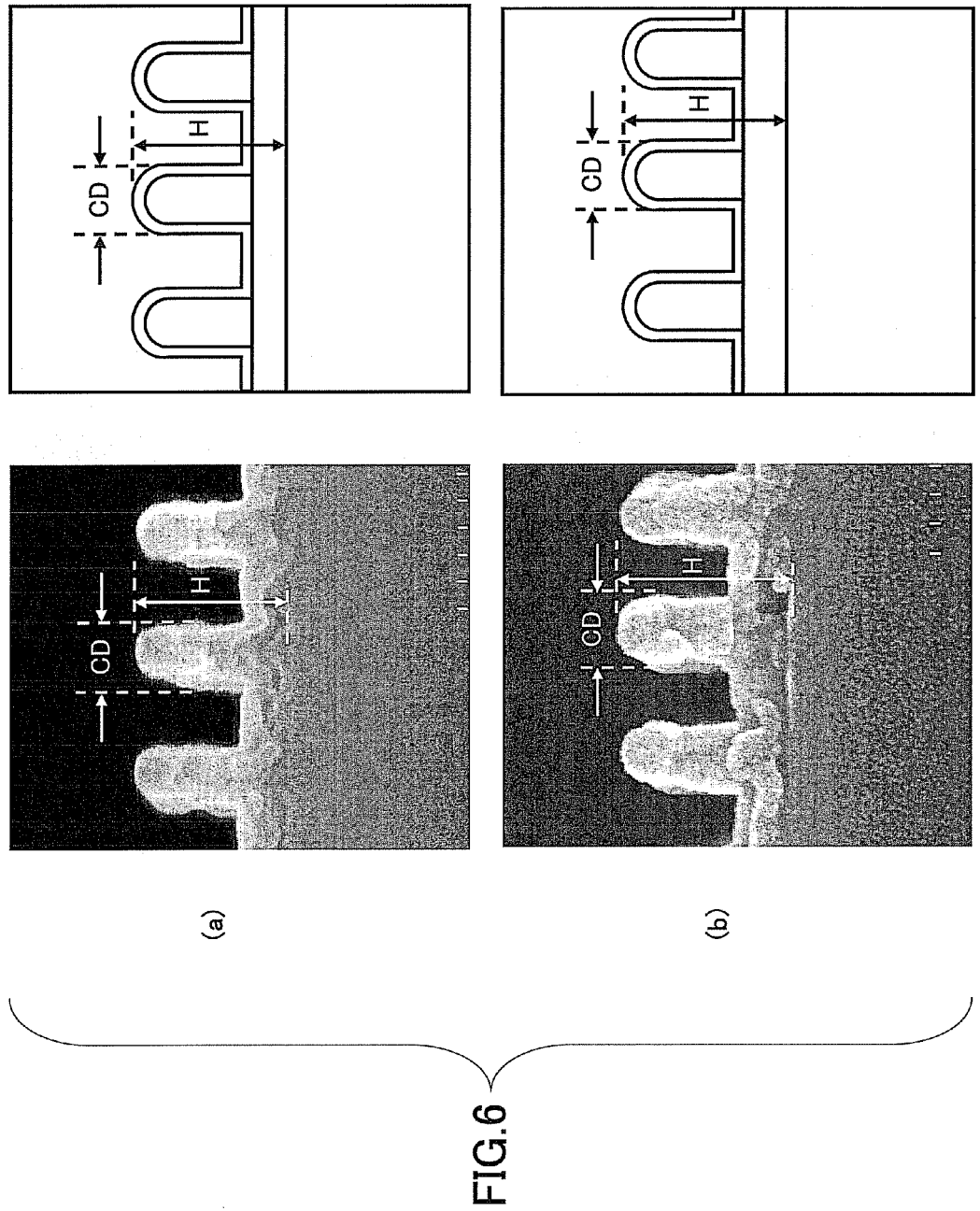
FIG. 6 includes scanning electron microscope images of the fine pattern structures and schematic views corresponding to the images.

Subsequently, the wafer with the protection film 105 including the first patterns 104c is transferred out from the etching chamber, and undergoes a steeping process. The steeping process was carried out in two ways. In a first steeping process, the wafer was steeped in an organic solvent of OK82 from TOKYO OHKA KOGYO CO., LTD., which is a mixed liquid of propylene glycol ethyl ether (PGME) and propylene glycol monomethyl ether acetate (PGMEA) at a ratio of 80:20 (=PGME:PGMEA). In a second steeping process, a photoresist developer was used in the place of the organic solvent. Before and after the steeping process, a width and a height of the first patterns 104c were measured with a critical dimension scanning electron microscope (CD-SEM). Examples of CD-SEM images of the first patterns 104c are illustrated in FIG. 6. Specifically, subsections (a) and (b) of FIG. 6 illustrate cross sections of the first patterns 104c before the steeping process (or, after the protection film deposition step) and the first patterns 104c after the steeping processes, respectively. In these images, a reference symbol CD represents the width of the first pattern 104c, and a reference symbol H represents a total value of a height of the first pattern 104c and a thickness of the BARC film 103, as schematically illustrated in inserts in the FIG. 6. These values are summarized in Table 1. Incidentally, CD value change ratios in Table 1 are obtained in accordance with the following expression. For example, the CD value change ratio of 6.7% (see Table 1) before and after the steeping process using the developer was obtained from (64−60)/60×100.

$$CD \text{ value change rate} = \frac{a\ CD \text{ value after the steeping process} - a\ CD \text{ value before the steeping process}}{a\ CD \text{ value before the steeping process}} \times 100 \quad (1)$$

The specific conditions are: a flow rate of HBr gas was 500 sccm; an inner pressure of the chamber of the etching apparatus was 13.3 Pa (100 mTorr); high frequency power applied to the upper electrode was 800 W; and a deposition time was 60 s. No high frequency power was applied to the lower electrode.

Even in Example 2, the steeping process was carried out and CD-SEM measurements of the widths CD and the total values H were carried out, in the same manner as Example 1. The widths CD and the values H are summarized in Table 1.

Example 3

In Example 3, the trimming step was carried out under the same conditions as Example 1, and then the protection film deposition step was carried out using a gas mixture of $CH_3F$ gas and $SF_6$ gas as the etching gas. A flow rate of $CH_3F$ gas was 200 sccm; a flow rate of $SF_6$ gas was 300 sccm; an inner pressure of the chamber of the etching apparatus was 2.66 Pa (20 mTorr); high frequency power levels applied to the upper electrode and the lower electrode were 600 W and 100 W, respectively; and a deposition time was 35 s.

Then, the steeping process was carried out and CD-SEM measurements of the widths CD and the total values H were carried out, in the same manner as Example 1. The widths CD and the values H are summarized in Table 1.

(Discussions)

As shown in Table. 1, the CD value of the first pattern 104c is slightly increased by 6.7% after the steeping process using the developer when the gas mixture of $CH_3F$ and HBr (Example 1) is used, while the CD value of the first pattern 104c is relatively greatly increased by 29% after the steeping process using the developer when the HBr gas is only used (Example 2). Such an increased CD value of the first pattern 104c after the steeping process using the developer may indicate that the first pattern 104c dissolves into the developer and is deformed. Therefore, the first patterns 104c are stable against the developer and thus can keep their own original

TABLE 1

|  | before steeping process | | after steeping process using organic solvent | | after steeping process using developer | |
|---|---|---|---|---|---|---|
|  | CD value of first pattern | total thk. of first pattern and BARC | CD value/CD value change ratio (%) | H (nm)/H change ratio (%) | CD value/CD value change ratio (%) | H (nm)/H change ratio (%) |
| Example 1 ($CH_3F$/HBr) | 60 | 165 | 53/−12 | 151/−8.5 | 64/6.7 | 177/7.3 |
| Example 2 (HBr) | 38 | 118 | peeled | peeled | 49/29 | 127/7.6 |
| Example 3 ($CH_3F$/$SF_6$) | 62 | 153 | 59/−4.8 | 152/−0.7 | 65/4.8 | 145/−5.2 |

Example 2

In Example 2, the trimming step was carried out under the same conditions as Example 1, and then the protection film deposition step was carried out using HBr gas, rather than the gas mixture of the $CH_3F$ gas and the HBr gas, as the etching gas.

shapes when the $CH_3F$ gas and the HBr gas are used (Example 1), compared to when only the HBr gas is used (Example 2).

In addition, an increase in the H value after the steeping process using the developer is smaller when the gas mixture of $CH_3F$ and HBr (7.3% in Example 1) is used than when the HBr (7.6% in Example 2) is only used. Such an increased H value may indicate that the underlying BARC film 103 is dissolved into the developer and changes its shape. Therefore, the shapes of the first patterns 104c are less likely to be changed when the gas mixture of $CH_3F$ and HBr is used, compared to when only the HBr is used.

Moreover, while the CD and the H values are only slightly changed after the steeping process using the organic solvent when the gas mixture of $CH_3F$ and HBr is used, the first patterns 104c are peeled off by the steeping process using the organic solvent when the HBr gas is used.

As stated above, use of the etching gas including the $CH_3F$ gas can substantially prevent the first patterns 104c from being deformed when photoresist (solution) is applied on the protection film 105 including the first patterns 104c in order to form the second photoresist film, compared to use of the etching gas not including the $CH_3F$ gas.

Next, Example 1 is explained in comparison with Example 3 with reference to Table 1. As listed, the CD value change ratio after the steeping process using the developer in Example 1, where the $CH_3F$ and HBr gases are used, and the CD value change ratio after the steeping process using the developer in Example 3, where the $CH_3F$ and $SF_6$ gases are used, are 6.7% and 4.8%, respectively, which may indicate that both gas mixtures of $CH_3F+HBr$ and $CH_3F+SF_6$ provide substantially the same effect. On the other hand, the H change ratio is decreased (−5.2%) when the $CH_3F$ and $SF_6$ gases are used, while the ratio is increased (7.3%) when the $CH_3F$ and HBr gases are used. This may indicate that a part of the underlying BARC film 103 is dissolved into the developer when the $CH_3F$ and $SF_6$ gases are used.

Namely, when the $CH_3F$ gas is used in combination with the HBr gas rather than the $SF_6$ gas, an enhanced protection effect against the organic solvent and the developer is provided.

As stated above, when the first patterns 104c are formed by depositing the protection film 105 from the reaction (or decomposition) products of the etching gas, and the second photoresist film 107 is formed on the protection film 105, the first patterns 104c are less likely to be dissolved into the organic solvent included in the photoresist coated thereon or the second photoresist film 107 and the developer used to develop the photoresist film 107. Namely, the first patterns 104c so formed are substantially prevented from being deformed when the second patterns 107b (see the subsection (g) of FIG. 2B) are formed. In addition, the gas mixture of the $CH_3F$ and HBr, the gas mixture of the $CH_3F$ and $SF_6$, and the HBr gas can provide greater advantage in this order.

Moreover, according to this embodiment of the present invention, the resist freezing process (hardening process) can be carried out by using the etching gas, without applying the silicon oxide film.

Furthermore, because the first trimming step and the protection film deposition step can be consecutively carried out in the same chamber of the etching apparatus in this embodiment, the number of the process steps can be reduced. In addition, because the etching gas can be used to deposit the protection film 105 at the protection film deposition step, no additional gas supplying system needs to be added to the etching chamber.

In addition, the first patterns 104c are formed of the reaction (or decomposition) products of the etching gas, i.e., a film containing C, F, H, and O atoms in this embodiment. Therefore, an etching rate ratio of the first patterns 104c with respect to the thin film 102 is substantially the same as an etching rate ratio of the second patterns 107b with respect to the thin film 102. Accordingly, when the thin film 102 is etched using the etching mask including the first patterns 104c and the second patterns 107b, the CD values of patterns transferred from the first patterns 104c can be substantially the same as the CD values of patterns transferred from the second patterns 107b.

If the first patterns are formed by depositing silicon oxide, the first patterns have a film containing Si, O atoms on the top. Such first patterns have a relatively largely different etching rate ratio with respect to the thin film 102, compared with the second patterns 107b made of photoresist. Therefore, the CD values of patterns transferred from such first patterns can be substantially the same as the CD values of patterns transferred from the second patterns 107b. Namely, this embodiment of the present invention provides a greater advantage over the conventional method in terms of uniformity in the CD values.

Incidentally, the CD values of the first patterns 104c can be controlled by deposition time at the protection film deposition step (S15). Table summarizes the CD values of the first patterns 104c formed by depositing the protection film 105 on the patterns 104b obtained at the first trimming step (S14) and the underlying BARC film 103 for corresponding deposition periods of time. Here, the patterns 104b have a CD value of 31 nm. CD value changes in Table 2 are obtained by subtracting the CD value of 31 nm of the patterns 104b from the CD values of the patterns 104c. In addition, the patterns 104b are obtained by trimming the patterns 104a having a CD value of 63 nm originating from the first photoresist film 104.

TABLE 2

|  | Depo. time (s) | CD value (nm) | CD value changes after first patterning process (nm) |
|---|---|---|---|
| after first pattern forming step (before trimming process) | — | 63 | — |
| after first trimming step (after trimming process) | — | 31 | — |
| after protection film deposition step (patterns 104c) | 30 | 46 | 15 |
|  | 55 | 60 | 29 |
|  | 60 | 63 | 32 |

Figure 7:
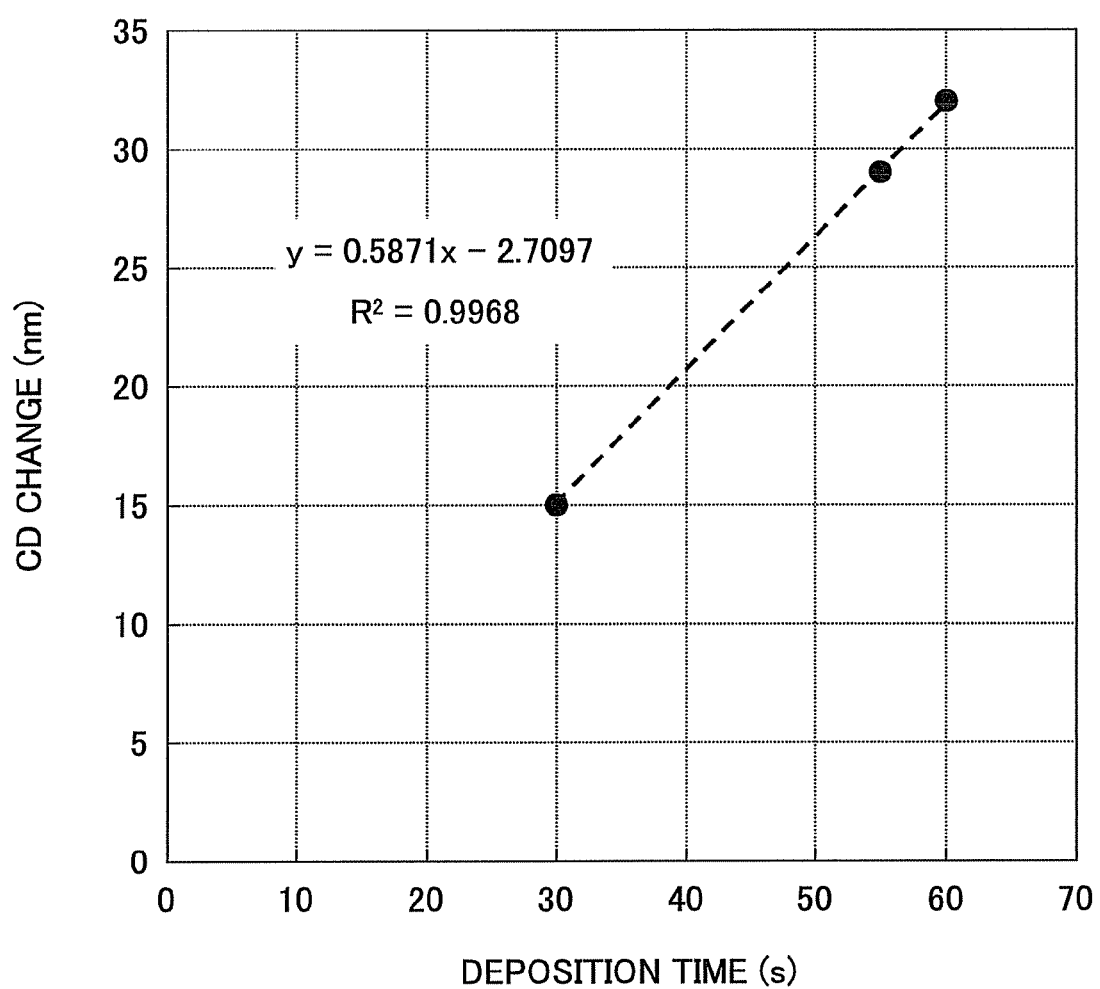
FIG. 7 illustrates a dependence of the CD value changes on the deposition time of the protection film.

FIG. 7 illustrates a dependence of the CD value changes on the deposition time of the protection film 105, based on Table 2. As a result of regression calculations carried out for the graph in FIG. 7, the following relationship of a CD value change y with respect to a deposition time x is obtained:

$$y=0.5871x-2.7097$$

$$R^2=0.9968$$

Because a y-intercept and a correlation coefficient $R^2$ are approximately 0 and 1, respectively, there is a linear relationship between the CD value change y and the deposition time x, which substantially passes through the original point.

In addition, the CD values of the second patterns 107b can be easily controlled by adjusting the trimming time at the second trimming step (S18). Moreover, the CD value of the first patterns 104c is not changed during the second trimming step (S18) because the first patterns 104c are formed by depositing the protection film 105, which is made of the reaction (or decomposition) products of the etching gas, on the patterns 104b and the BARC film 103. Therefore, the CD values of the first patterns 104c and the second patterns 107b can be easily controlled to be substantially the same, and thus the patterns transferred from the first patterns 104c and the second patterns 107b can be substantially the same.

In the fine pattern forming method according to this embodiment of the present invention, the first patterns 104c having a predetermined CD value are obtained by adjusting the trimming time at the first trimming step (S14) and the deposition time at the protection film deposition step (S15), and the second patterns 107b having the same predetermined CD value are obtained by adjusting the trimming time at the second trimming step (S18). The reason is explained with reference to FIG. 8.

Figure 8:
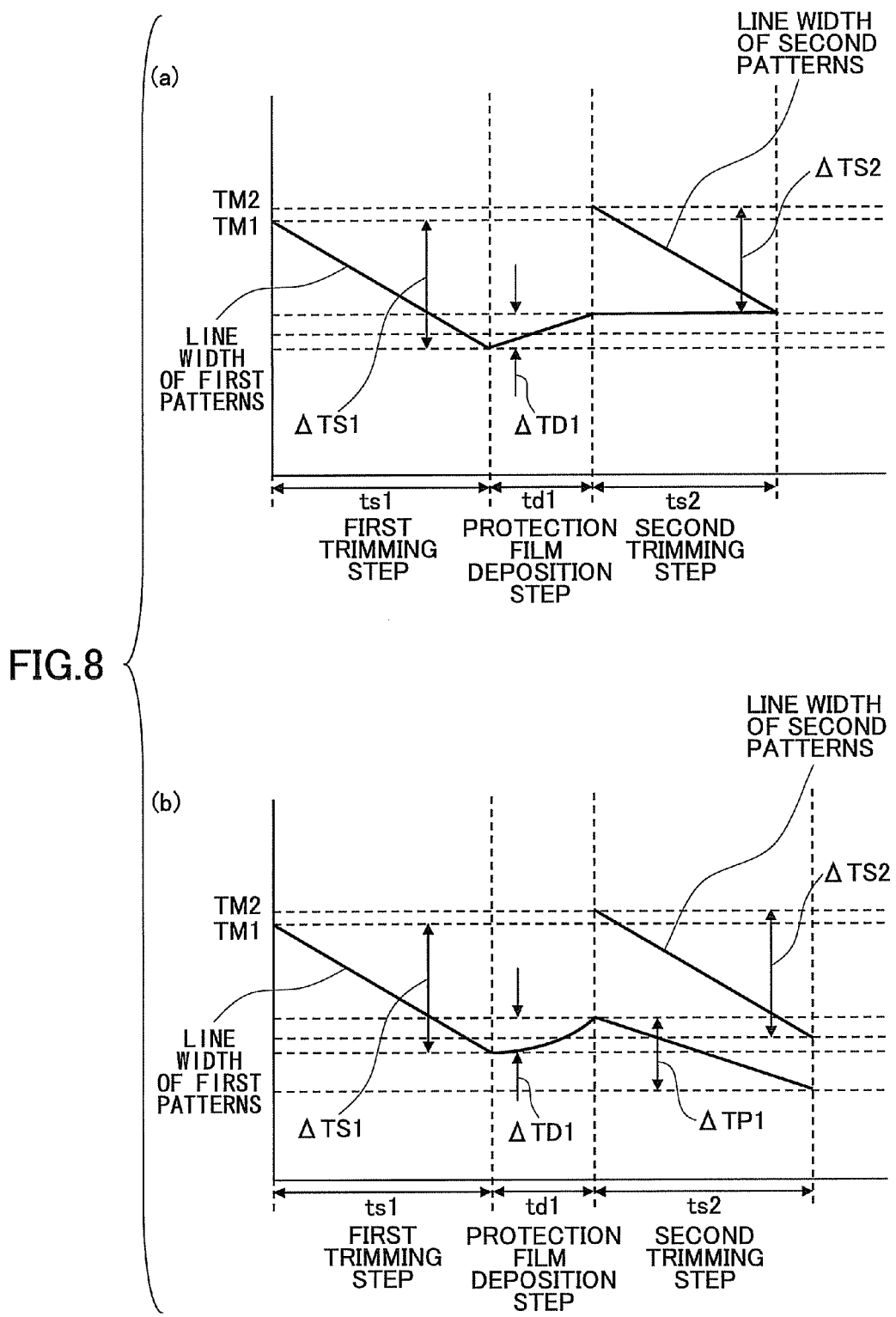
FIG. 8 includes graphs for explaining advantages of the fine pattern forming method according to the second embodiment of the present invention, in comparison with the conventional fine pattern forming method.

Referring to a subsection (a) of FIG. 8, a line width of the patterns 104a (the subsection (c) of FIG. 2) formed at Step S13 (the first pattern forming step) is TM1. Then, when the first trimming step (S14) is carried out with respect to the patterns 104a for trimming time ts1, each of the patterns 104c becomes narrower from each of its sides, and thus the patterns 104b (the subsection (d) of FIG. 2) having the line width of TM1−ΔTS1 are obtained. Because the line width of the pattern 104a linearly decreases with the trimming time, as shown in the subsection (a) of FIG. 8, the ΔTS1 can be easily controlled by adjusting the trimming time ts1.

Next, when the protection film deposition step (S15) is carried out with respect to the patterns 104b for deposition time td1, the protection film 105 is deposited on the upper surface and side surfaces of each of the patterns 104b, and thus the first patterns 104c (the subsection (c) of FIG. 1B) having a line width TM1−ΔTS1+ΔTD1 are obtained. Because a thickness of the protection film 105 is substantially proportional to the deposition time as explained with reference to FIG. 7, the ΔTD1 can be easily controlled by adjusting the deposition time td1. Namely, the line width TM1−ΔTS1+ ΔTD1 can be easily controlled by adjusting the trimming time ts1 and/or the deposition time td1.

Next, the second photolithography process (Steps S16 and S17) is carried out, and thus the patterns 107a having a line width TM2 are obtained (see the subsection (a) of FIG. 8).

Next, when the second trimming step (S18) is carried out with respect to the patterns 107a for trimming time ts2, each of the patterns 107a becomes narrower from each of its sides, and thus the second patterns 107b (the subsection (h) of FIG. 2C) having a line width of TM2−ΔTS2 are obtained. Also at the second trimming step, the line width of the second patterns 107 can be easily controlled by adjusting the trimming time ts2. In addition, the line width of the first patterns 104c is scarcely changed although the first patterns 104c are exposed to the oxygen-radicals or ozone gas during the second trimming step, because the protection film 105 is tolerant of the oxygen-radicals or ozone gas. Therefore, the line width TM2−ΔTS2 of the second patterns 107b can be set to be substantially the same as the line width TM1−ΔTS1+£TD1 of the first patterns 104c, without taking into consideration the change in the line width of the first patterns 104c during the second trimming step.

Here, referring to a subsection (b) of FIG. 8, a case where a silicon film is deposited as the protection film using an aminosilane gas and oxygen plasma or ozone gas is explained for comparison purposes. In this case, because a thickness of the silicon oxide film is not proportional to deposition time, especially at an initial stage of the deposition, the line width of the first patterns may not be increased linearly with the deposition time. Therefore, it is relatively difficult to obtain the first patterns having the line width TM1−ΔTS1+ΔTD1 by adjusting the deposition time td1.

In addition, the protection film made of silicon oxide may be trimmed by the oxygen-radicals or ozone gas during the second trimming step. When this happens, the line width of the first pattern 104c becomes TM1−ΔTS1+ΔTD1−ΔTP1, as shown in the subsection (b) of FIG. 8. Therefore, the ΔTP1 needs to be considered in order to make the line width TM2−ΔTS2 of the second patterns substantially equal to the line width TM1−ΔTS1+ΔTD1−ΔTP1 of the first patterns. Additionally, in the case of ΔTP1/ts2≧ΔTS2/ts2, the line width TM2−ΔTS2 of the second patterns cannot be equal to the line width TM1−ΔTS1+ΔTD1−ΔTP1 of the first patterns. Moreover, when the line width TM2 is relatively large, it is relatively difficult to make the width the line width TM2−ΔTS2 of the second patterns equal to the line width TM1−ΔTS1+ ΔTD1−ΔTP1 of the first patterns, even if the trimming time ts2 is increased, because the increased trimming time ts2 makes the first patterns narrower.

In view of the above explanation with reference to FIG. 8, an advantage of this embodiment of the present invention is understood.

Practically, trimming rates of the patterns 104a in the first trimming step (S14 in FIG. 1A) and the patterns 107a in the second trimming step (S18 in FIG. 1B), and a deposition rate of the protection film 105 in the protection film deposition step (S15 in FIG. 1A) are obtained through preliminary experiments, which makes it possible to make the CD values of the first patterns 104c and the second patterns 107b in the same manner as the above.

Second Embodiment

Figure 9B:
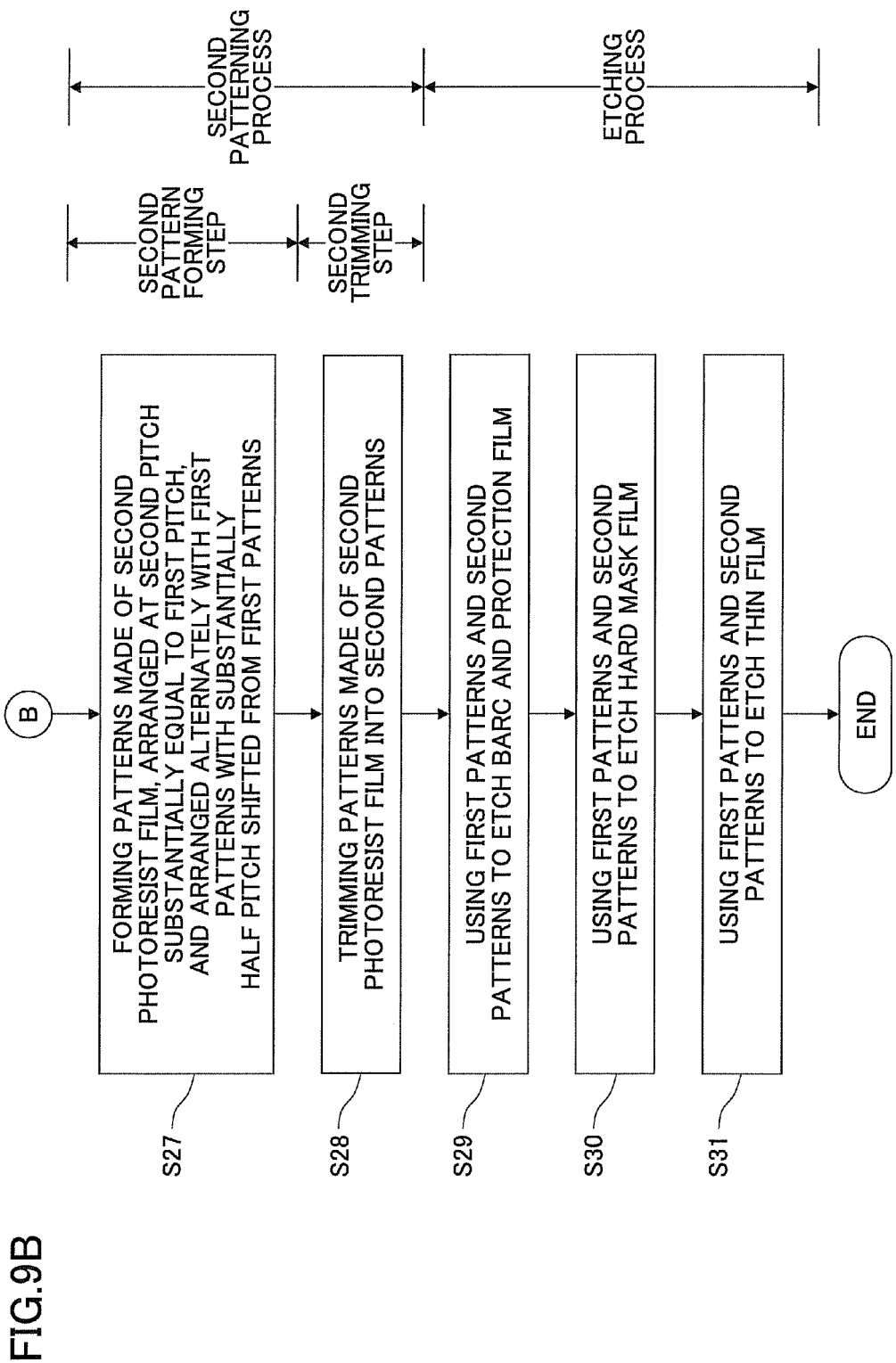
FIG. 9B is a flowchart for explaining steps of the fine pattern forming method according to the second embodiment of the present invention, following the flowchart of FIG. 1A.

Referring to FIGS. 9A through 10O, a fine pattern forming method according to a second embodiment of the present invention is explained. FIGS. 9A and 9B are flowcharts for explaining the fine pattern forming method according to the second embodiment. FIGS. 10A through 10C illustrate schematic cross-sectional views of a fine pattern structure of corresponding steps. Specifically, a subsection (a) of FIG. 10A through a subsection (k) of FIG. 10C illustrate cross-sectional views of fine pattern structures after corresponding Steps S21 through S31 in FIGS. 9A and 9B.

Figure 10A:
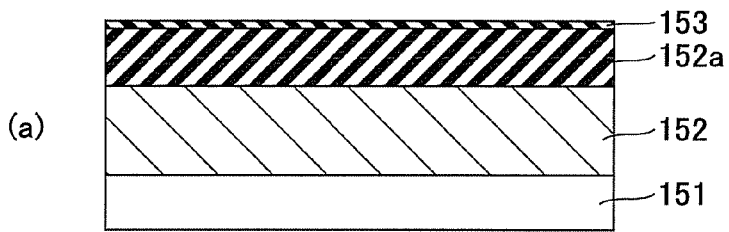
FIG. 10A illustrates cross-sectional views of fine pattern structures at corresponding steps of the fine pattern forming method according to the second embodiment of the present invention (part 1)
Figure 10A:
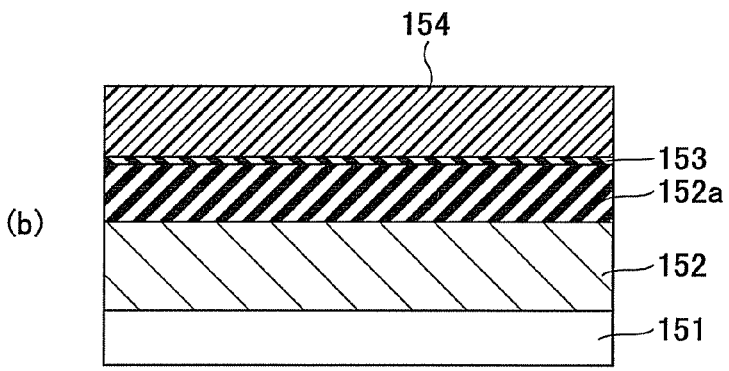
Figure 10A:
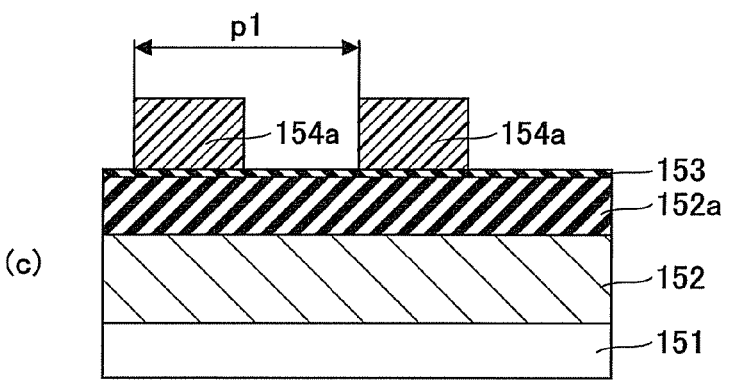
Figure 10A:
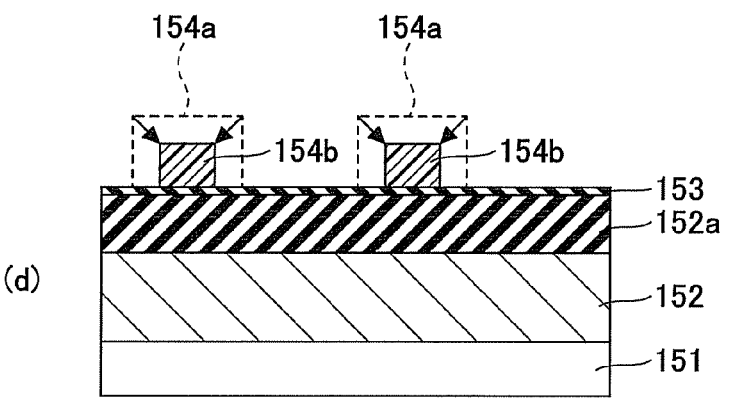

At Step S21, a thin film 152 and a hard mask film 152a are formed on a semiconductor substrate 151 in this order, as shown in the subsection (a) of FIG. 10A. The thin film 152 is patterned into a fine pattern. The hard mask film 152a is patterned later to be an etching mask for use in etching the thin film 152, and thus is made of a material that is different from the material of the thin film 152 and can provide a sufficient etching rate ratio with respect to the thin film 152. For example, when the thin film 152 is made of an electrically conductive poly-silicon film, the hard mask film 152a may be made of silicon oxide or silicon nitride. In addition, a bottom anti-reflection coating (BARC) film 153 is formed by applying an anti-reflection material on the hard mask film 152a at Step S21.

Next, a first photolithography process (Steps S22 and S23) is carried out. First, at Step S22, a first photoresist film 154 is formed by coating photoresist on the BARC film 153, as shown in the subsection (b) of FIG. 10A.

At Step S23, the first the photoresist film 154 is patterned into patterns 154a arranged at a first pitch of p1 by photolithography, as shown in the subsection (c) of FIG. 10A. Also in this embodiment, the first pitch of p1 is the lowest that can be realized based on the resolution limit of an exposure apparatus used widely in this industry.

Next at Step S24 (a first trimming step), the patterns 154a are trimmed into patterns 154b, as shown in the subsection (d) of FIG. 10A. The trimming process may be carried out in an etching apparatus using oxygen-containing plasma or ozone gas under the same conditions as those at Step S14 in the first embodiment.

Then, Step S25 (a protection film deposition step) is continuously carried out in the same chamber of the etching apparatus that has been used at Step S24. Specifically, an etching gas including fluorocarbon gas and/or halogen gas is supplied to the chamber of the etching apparatus in the same manner as Step S15 in the first embodiment. The etching gas is decomposed or reacted with the patterns 154b originating from the first photoresist film 154, and/or the BARC film 153, and thus the reaction (decomposition) products are deposited on the patterns 154b and the BARC film 153, so that the protection film 155 including the first patterns 154c are obtained, as shown in the subsection (e) of FIG. 10B.

Next, a second photolithography process (Steps S26 and S27) is carried out. First, at Step S26, a second photoresist film 157 is formed by coating photoresist on the protection film 155, as shown in the subsection (f) of FIG. 10B.

Incidentally, another BARC film may be formed by applying an anti-reflection coating material on the protection film 155 between Step S25 and Step S26. In this case, the second photoresist film 157 is formed on the BARC formed on the protection film 155.

Subsequently, a second patterning process (Steps S27 and S28) is carried out. First, at Step S27 (a second pattern forming step), the second photoresist film 157 formed at Step S26 is exposed to exposure light and developed, so that patterns 157a arranged at a second pitch p2 are formed, as shown in a subsection (g) of FIG. 10B. In this embodiment, the patterns 157a take the same line-and-space pattern as the patterns 154a originating from the first photoresist film 154, and thus the second pitch p2 of the patterns 157a is the same as the first pitch p1 of the patterns 154a. In addition, each of the patterns 157a is located in substantially the center between its two adjacent first patterns 154c formed at Step S25, as shown in the subsection (g) of FIG. 10B. Namely, the patterns 157a are arranged alternately with the first patterns 154c shifted by half of the first pitch p1 from the corresponding first patterns 154c.

Next, at Step S28 (a second trimming step), the patterns 157a originating from the second photoresist film 157 are trimmed, so that second patterns 157b are obtained, as shown in the subsection (h) of FIG. 10B. The trimming process is preferably carried out, for example, under an environment including oxygen radicals or ozone gas at room temperature through about 100° C.

Referring to the subsection (h) of FIG. 10B, an etching mask composed of the first patterns 154c and the second patterns 157b is formed after the second trimming step (Step S28). Because the first patterns 154c and the second patterns 157b, which are formed separately, are alternately arranged shifted by half of the first (or second) pitch p1 (or p2) from each other, the etching mask has its pitch p3 corresponding to half of the first (or second) pitch p1 (or p2), in this embodiment. Namely, this etching mask has a pitch below the resolution limit of the exposure apparatus.

Subsequently, an etching process (Step S29 through S31) is carried out. First at Step S29, the protection film 155 and the BARC film 53 are etched using the etching mask having the first patterns 154c and the second patterns 157b. With this, the hard mask film 152a becomes exposed between the first pattern 154c and the second pattern 157b, as shown in the subsection (i) of FIG. 10C. Next, at Step S30, the hard mask film 152a is etched using the etching mask, so that third patterns are obtained. The third patterns have a top view shape reflecting the first patterns 154c and the second patterns 157b. Then, the thin film 152 is etched using the third patterns (and the first patterns 154c, the patterns 154b, and the second patterns 157b that are remaining on or above the third patterns), as shown in the subsection (k) of FIG. 10C. Because a pitch p3' is the same as the pitch p3 (the subsection (h) of FIG. 10B) of the etching mask composed of the first patterns 154c and the second patterns 157b, a pitch p4 of the thin film 152 etched using the third patterns is substantially the same as the pitch p3, and thus the etched thin film 152 has a pitch below the resolution limit. Therefore, according to the fine pattern forming method according to the second embodiment of the present invention, the fine patterns having a pitch below the resolution limit can be formed in the same manner as the first embodiment.

In addition, the number of process steps can be reduced, and the difference of the CD values between the first patterns 154c and the second patterns 157b can be reduced in the same manner as the first embodiment. Moreover, because the etching mask for etching the thin film 152 is formed from the hard mask film 152a that may have a higher etching rate ratio with respect to the thin film 152, the fine pattern in the thin film 152 can be realized with higher precision, and the difference of the CD values between the first patterns 154c and the second patterns 157b can be further reduced.

While the present invention has been described in reference to the foregoing embodiments, the present invention is not limited to the disclosed embodiments, but may be modified or altered within the scope of the accompanying claims.

What is claimed is:

1. A fine pattern forming method for patterning a film formed on a substrate, the fine pattern forming method comprising steps of:
    forming patterns made of a first photoresist film, arranged at a first pitch on the film;
    trimming the patterns made of the first photoresist film;
    depositing a protection film on trimmed patterns made of the first photoresist film, the protection film being made of reaction products of an etching gas, thereby obtaining first patterns;
    forming other patterns made of a second photoresist film, arranged at a second pitch, on the protection film, the other patterns made of the second photoresist film being shifted by half of the first pitch from the corresponding patterns made of the first photoresist film;
    trimming the other patterns made of the second photoresist film into second patterns; and
    etching the film using the first patterns and the second patterns,
    wherein the step of trimming the patterns made of the first photoresist film and the step of trimming the other patterns made of the second photoresist film are carried out using at least one of oxygen radicals and ozone gas, and
    wherein the protection film made of the reaction products of the etching gas is tolerant of the oxygen radicals and the ozone gas.

2. The fine pattern forming method of claim 1, wherein the patterns made of the first photoresist film are formed on a hard mask film that covers the substrate in the step of forming the patterns made of the first photoresist film; and
    wherein the hard mask film is etched using the first patterns and the second patterns, and the film is etched using the etched hard mask film in the step of etching the film.

3. The fine pattern forming method of claim 1, wherein the protection film is deposited in an etching apparatus by supplying an etching gas in the step of depositing the protection RIM.

4. The fine pattern forming method of claim 3, wherein the step of trimming the patterns made of the first photoresist film is carried out in the etching apparatus, and wherein the protection film is consecutively deposited in the etching apparatus in the step of depositing the protection film.

5. The fine pattern forming method of claim 1, wherein the patterns made of the first photoresist film are formed via an anti-reflection coating film in the step of forming the patterns made of the first photoresist film.

6. The fine pattern forming method of claim 1, wherein the first patterns having a predetermined line width are obtained by adjusting a trimming time in the step of trimming the patterns made of the first photoresist film and/or a deposition time in the step of depositing the protection film.

7. The fine pattern forming method of claim 1, wherein the film is at least one of silicon nitride, silicon oxide, amorphous silicon, and poly silicon.

8. The fine pattern forming method of claim 5, wherein the anti-reflection coating film is at least one of amorphous carbon, poly phenol, and photoresist.

9. The fine pattern forming method of claim 1, wherein the etching gas includes fluorocarbon.

10. The fine pattern forming method of claim 1, wherein the etching gas includes a halogen-containing gas.

11. The fine pattern forming method of claim 9, wherein the fluorocarbon is at least one of $CH_3F$, $CHF_3$, and $CF_4$.

12. The fine pattern forming method of claim 10, wherein the halogen-containing gas is at least one of HBr and $SF_6$.

13. The fine pattern forming method of claim 1, wherein the step of trimming the patterns made of the first photoresist film is carried out using at least one of an oxygen-containing gas plasma and ozone gas.

14. The fine pattern forming method of claim 13, wherein the oxygen-containing gas plasma is obtained by activating at least one of $O_2$ gas, NO gas, $N_2O$ gas, $H_2O$ gas and $O_3$ gas into plasma.

* * * * *